US005747986A

United States Patent [19]
Hristoforou

[11] Patent Number: 5,747,986
[45] Date of Patent: *May 5, 1998

[54] ARRAY SENSORS BASED ON THE MAGNETOSTRICTIVE DELAY LINE TECHNIQUE

[76] Inventor: Evangelos Hristoforou, c/o V. Mantzikas, P.O. Box 3884, IO2IO Athens, Greece

[ * ] Notice: The terminal 14 months of this patent has been disclaimed.

[21] Appl. No.: 880,174

[22] Filed: May 6, 1992

[51] Int. Cl.$^6$ .............................. G01B 7/14; G01R 33/02; G08C 21/00; G01L 1/00
[52] U.S. Cl. .............................. 324/207.13; 73/862.046; 73/862.69; 178/18; 324/207.15; 324/207.21; 324/244; 324/247; 324/252; 324/260; 333/148
[58] Field of Search ..................... 324/207.13, 207.14, 324/207.17, 207.21, 207.22, 207.24, 244, 247, 252, 260; 73/862.041, 862.042, 862.046, 862.69; 341/32; 178/17 C, 18–20; 333/148

[56] References Cited

U.S. PATENT DOCUMENTS 4,924,711  5/1990  Reilly ................................. 73/862.046

OTHER PUBLICATIONS

Hristoforou et al; "Characteristics of a Bending Beam Force Sensor Array Element", *IEEE Trans. on Magnetics*, vol. 27, No. 6, Nov. 1991 pp. 5244–5246.

Hristoforou et al; "A Digitizer Based on Reflections in Delay Lines" *J. Appl. Phys.* 70(8), 15 Oct. 1991, pp. 4577–4580.

Hristoforou et al; "New Mechanical Stress Transducers Based on Amorphous Alloys", IEEE Trans on Magnetics, vol. 26, No. 5, Sep. 1990, pp. 1563–1565.

*Primary Examiner*—Gerard R. Strecker

[57] ABSTRACT

Array sensors are described which are based on the magnetostrictive delay line technique, where sensing is based on the modification of the magnetic circuit along the magnetostrictive delay line. The proposed array sensors can perform a quantitative measurement of signals instead of the merely sensing activity performed by sensors of the prior art. Further advantageous characteristics of the proposed array sensors is that magnetoresistive devices and alternatively a detecting magnetostrictive delay line with two detecting coils at the ends thereof are used at the output of the sensor array, and that the detected pulsed width T is monitored instead of the peak voltage, this offering an improved response of the proposed array sensors. The above improvements are used in various applications and specifically are proposed novel digitizers and displacement sensors as well as a magnetic field distribution sensor.

23 Claims, 28 Drawing Sheets

5,747,986

ARRAY SENSORS BASED ON THE MAGNETOSTRICTIVE DELAY LINE TECHNIQUE

THE FIELD OF THE INVENTION

The present invention relates to the field of the art of array sensors and especially sensors operating under the principle of magnetostrictive delay line technique, useful in various applications, novel characteristics being also proposed to improve the delay line behaviour.

THE BACKGROUND ART

Sensing devices and array sensors using current pulses in a conductor to generate acoustic pulses in a magnetostrictive delay line have long been known in the art. Acoustic delay lines comprising an elongated delay element which preferably is a ribbon or wire of magnetostrictive material, an input coil coupled at the point of origin of the delay element and an output coil coupled at the receiving point of the delay element, have also been known and found extensive applications in the field of electronics and also as means of temporarily storing and recirculating information.

The magnetostriction effect implies that any change of the longitudinal magnetic field along the length of the delay line due to any change of current at the coil provided at the point of origin of the delay line in turn causes an acoustic stress which being propagated along the delay line can be received by means of the output coil due to the inverse magnetostriction effect. This inverse magnetostriction effect implies that the stress waves travelling along the delay line produce dimensional changes therein, which when passing through the receiving coil vary the reluctance of the magnetic circuit and thereby produce a change of flux causing a voltage output signal to be induced in the output coil. A plurality of voltage output signals is received using an array of sensors, as will be presented hereinafter.

A first object of the invention is to achieve measurement of multiplexed signals in a single sensor or array of sensors at a low cost and the highest degree of accuracy.

The measurement of acoustic signals is conducted by means of measuring the change of the magnetoelastic wave, at either the point of origin or the receiving point or at any point of the magnetostrictive delay line, in between them, with respect to an applied condition, and in this respect it is important to examine the delay line characteristics which can act negatively towards an accurate measurement.

A magnetostrictive delay line used in the field of the invention presents various characteristics such as level of uniformity, hysteresis, linearity, response delay, DC magnetic field bias response, reflections at the ends of the delay line, secondary waveforms, pulse width and frequency response.

One severe problem experienced when using e.g. Metglas 2605SC or Fe77.5Si7.5B15 wire delay lines, is their non-uniform response, i.e. the unequal response at the receiving point under the same conditions of applied pulsed and DC bias magnetic fields at different points of origin.

It is therefore an object of the invention to propose a normalization process with stress-annealed delay lines, the substantive steps of the method by which the proposed normalization process is carried out being defined hereinafter.

To implement the object of a low cost, high accuracy sensor and sensor array in accordance with the invention, various improvements have been proposed in the magnetostrictive delay line technique. By way of example, Reilly (U.S. Pat. No. 4,924,711) proposed that the coils conventionally used at the points of origin of the proposed sensors based on the magnetostrictive delay line technique be replaced by orthogonal pulsed current conductors, through which pulsed current is transmitted, these conductors being arranged preferably at right angles to the delay lines. The advantage of this replacement in applications where the magnetostrictive delay lines are used in array devices (analog multiplexers), is the substantial reduction of cost of the array sensors compared with the conventional arrangement using delay lines with exciting coils.

Main improvements in the magnetostrictive delay line technique are also proposed in the present invention, which are briefly summarised below:

a) Whilst sensors based on the magnetostrictive delay line technique have been proposed in the past to operate by means of conversion of the magnetic energy to mechanical (acoustic) energy, i.e. using the inherent property of magnetostrictive materials, various methods are used in implementing these sensors, always working with the same magnetostrictive delay line technique. By way of example, the abovementioned U.S. Pat. No. 4,924,711 proposes changing the magnetic permeability of either one of two magnetostrictive members in order to effect a change in the magnetic circuit.

In the contrary, the present invention proposes changing the magnetic circuit in array sensors aimed to measure displacement by means of varying the geometry of the same.

Since in accordance with preferred embodiments of the present invention, sensing and the subsequent displacement measurement is based on the modification of magnetic circuit, the delay line remains always unstressed and its magnetic characteristics do not change.

A further advantageous characteristic of this invention is that it effects a quantitative measurement of signals and not simply a sensing activity as is the case with the sensors of the prior art.

b) Delay line arrays of the prior art employ a receiving coil arrangement at their outlet, whilst in the present invention magnetoresistive devices are proposed in replacement of the conventional receiving coil arrangement. The magnetoresistive devices are advantageous over the receiving coil means of the prior art in that they may be handily fitted onto the delay line and thereby substantially decrease the cost of labour associated with fabricating such a structure. Furthermore it should be noted that if coils are used for detecting the propagating acoustic pulse, then the detected output is proportional to the first derivative of the flux with respect to time, whilst use of a magnetoresistive device can give a voltage output which is proportional to the flux change. This simplifies the manufacture of the detecting means.

c) Whilst in the prior art a plurality of sensing elements is required to detect acoustic signals from a delay line array, a novel technique is proposed in the present invention wherein when only one input is applied to a delay line array, then the acoustic signal is detected by means of coupling the given array with one delay line and two detecting coils at the ends thereof, the specific place whereupon the input was applied being detected by means of counting the delay time.

If the detecting magnetostrictive delay line is oriented at an angle of 45 degrees with respect to the arrangement of sensing magnetostrictive delay lines, then the propagating acoustic stress causes changes in the flux of the sensing magnetostrictive delay lines, so that the presence of a detecting magnetostrictive delay line close to the propagating acoustic stress results in a magnetic coupling of the detecting magnetostrictive delay line with the sensing magnetostrictive delay lines. It is observed that such a coupling results in a voltage output at the detecting coils on either side of the detecting magnetostrictive delay line, equal to at least 15% of the conventional magnetostrictive delay line output.

Alternatively, when a sensing magnetostrictive delay line array is used to detect a single acoustic pulse, its output can be serialised using a detecting magnetostrictive delay line, as follows: detecting coils are used in all magnetostrictive delay lines, their output is amplified and the amplified signal is passed through a Field Effect Transistor (FET). The output of the FET causes an acoustic signal in a detecting magnetostrictive delay line, resulting thus in serialisation of the outputs of all the sensing magnetostrictive delay lines in the detecting magnetostrictive delay line.

This facilitates the mechanical structure of such a sensing magnetostrictive delay line array, the design and manufacture of electronics needed for storing all the data of the sensing magnetostrictive delay line array and makes detection of signals faster.

d) The output of a sensing magnetostrictive delay line array is measured by means of the peak value of the voltage output of the detecting coil, Vo. However measurement of this parameter results in a non linear and non uniform response of the magnetostrictive delay lines. In the present invention it is proposed that the output of a sensing magnetostrictive delay line array is measured by means of the width T i.e. the duration of the detected pulsed output T, by using a voltage threshold comparator. It has been observed that this alternative measurement results in at least 20% more linear response of the magnetostrictive delay line and further in at least 50% reduction of the nonuniformity of the magnetostrictive delay lines as applied in cast and flash-stress annealed amorphous alloys. Furthermore, normalisation process with respect to the pulse width T, instead of the peak voltage output Vo, increases standardisation of the uniformity of the magnetostrictive delay line response from 0.5% to 0.1%.

All the above mentioned improved characteristics in the magnetostrictive delay line technique are advantageously employed in the array sensors proposed in the present invention. A representative account of the state of the art of array sensors can be found in the abovementioned U.S. Pat. No. 4,924,711 of Reilly as well as in the following publications:

PhD Thesis of Evangelos Hristoforou, University of London, 1991.

IEEE Trans. Mag, Vol—26, p. 1563, 1990.

J.Appl. Phys., Vol. 70, p. 4557, 1991.

IEEE Trans. Mag, Vol—27. November 1991.

At first, referring to two-dimensional sensors and in particular sensors wherein the measured condition is displacement of objects along a surface, we can differentiate between small and large displacement sensors, depending on the range of measured displacement.

Together with Reilly's U.S. Pat. No. 4,924,711 the following patents can be mentioned to relate in this field of the art:

U.S. Pat. No. 3,517,343 of Crim.
U.S. Pat. No. 4,028,619 of Edwards.
U.S. Pat. No. 4,298,861 of Tellerman.
U.S. Pat. No. 4,344,068 of Thompson et al.
U.S. Pat. No. 4,481,821 of Chamuel.
U.S. Pat. No. 4,526,043 of Boie et al.
U.S. Pat. No. 4,598,595 of Vranishi et al.
German patent 2519012.

An account of publications, other than patents can also be found in the list of publications cited and listed in Reilly's U.S. Pat. No. 4,924,711.

Referring first to two-dimensional small displacement sensors one can find references to a number of small displacement sensors in the literature as well as in the market. Strain gauges are an example of a very small displacement sensor, while some silicon diaphragms offer a larger range of measurable displacement.

An illustrative reference on strain gauges is provided in:

M. Dean and R. D. Douglas: "Semiconductors and conventional strain gauge", Academic Press, New York, 1962.

References on silicon diaphragms are listed below:

J. Knutti: "Silicon microstructure sensors", Sensor '88 Conference, May 1988, Nuremberg, West Germany, and S. C. Terry: "A 31-element linear array of pressure sensors fabricated on a single silicon diaphragm", Transducers '89, Montreaux, Switzerland, 1989.

Optical methods are also useful when an accurate measurement is required, whilst magnetic sensors are most commonly used for detecting larger displacement and they are based on the LVDT technique, etc.

A reference to optical displacement sensors is:

C. Erbeia et al: "Integrated optics displacement sensor connected with optical fibres", Springer Proceedings in Physics, Optical Fibre Sensors, Vol. 44, pp. 234–239, 1989.

References on magnetic displacement sensors are listed below:

Y. Kano et al: "New linear variable differential transformer with square coils", IEEE Trans. on Magnetics, MAG-26, pp. 2020–2022, 1990, and Y. Kano et al: "Linear position detector with rod shape electromagnet", IEEE Trans. on Magnetics, MAG-26, pp. 2023–2025, 1991.

All these devices have a common principle: although they are sufficiently accurate and linear, they cannot be easily formed in arrays for measuring distribution of displacement, since discrete sensors are to be used. Hence, the whole structure becomes expensive.

It is therefore an object of the present invention to propose new small displacement distribution sensors employing the earlier mentioned improvements in the magnetostrictive delay line technique, the sensing technique being based on the change of the magnetic circuit at a sensing point when changing the distance of a soft magnetic material from the sensing point, i.e. crossing point of the magnetostrictive delay line and a conductor.

Such small displacement distribution sensors are not appropriate for the measurement of displacement exceeding 1.5 or 2 mm, since their sensitivity vanishes. This therefore necessitates usage of another family of sensors, the so called large displacement ones.

Referring first to two-dimensional large displacement sensors it must be noted that using discrete devices for making sensor arrays is not the best suggestable solution, because of the high final cost, although some of their characteristics are attractive (linearity, hysteresis etc.).

Existing devices of integrated sensor arrays are either for one use as they have to be reshaped after any measurement, or of general purpose made of silicon diaphragms. These silicon diaphragms have some very attractive characteristics, such as 0.25% linearity, no hysteresis and homogeneous behaviour, but their small sensing area (order of a few μm), makes them non usable for larger sensing surfaces.

The present invention proposes integrated displacement sensor arrays able to measure displacement up to 20 mm. Their sensing area is typically of the order of one square meter.

They are based on the magnetostrictive acoustic delay line technique and especially on the change of the peak (and alternatively pulse width) of the received pulsed voltage output due to the change of the DC magnetic bias field at either the point of acoustic stress origin, or at the receiving coil area which is obtained by using moving magnet technique.

A further object of the present invention is to exploit the above defined properties of large displacement sensors, to obtain measurement of displacement in three demensions. A three-dimensional position sensor, being proposed in the present invention is based on the fact that the response of the sensing magnetostrictive delay line (either peak voltage Vo or pulse width T) changes isotropically due to the spherical motion of an isotropic magnet at either the sensing or the detecting point.

This means that the response of the magnetostrictive delay line is the same for a spherical movement of this magnet when its distance and magnetic pole orientation is identical with respect to the sensing point.

The sensing core position is therefore defined using interpolation of magnitude of the response of neighbouring sensing points. This is the way in which a large displacement sensor working in a three-dimensional mode is proposed to operate with a single moving core, capable of detecting the position of this single core in a volume instead of in a planar surface.

The above described improved characteristics in the magnetostrictive delay line technique may also be advantageously employed with respect to array sensors, wherein the measured condition is other than the displacement of objects along a surface. By way of example herein is also proposed a force sensor array based on distortion in delay lines.

Low compliance force sensing devices are known in the prior art and may also be found in the market.

It is therefore a further object of the present invention to propose a force sensor whose operation is based on the herein proposed improved magnetostrictive delay line technique, and especially on the change of the peak value (and alternatively the pulse width) of the received pulsed voltage output due to a force applied at the point where the pulse is caused, which force sensor provides advantageously predictable performance and eliminated hysteresis operation over the force sensors of the prior art, whilst it also has a substantially reduced cost due to the ease of assemblying it and the low cost of materials and electronics used.

The above defined objects of the present invention both with regard to improvements in the magnetostrictive delay line technique and to integrated array sensors employing these novel characteristics, provide for a vast field of applications. By way of example herein below will be discussed certain such applications.

Magnetic field sensors using various sensing techniques are known in the prior art.

These sensors are able to measure magnetic field from DC up to very high frequencies, with a high degree of accuracy and sensitivity, although they are not able to measure field distribution.

The need of measuring such a distribution over a surface leads to specifications along the following lines:

A resolution of the order of 1 mm is required, while a typically measurable field surface might be of the order of 1×1 square meter.

At least 2-dimensional field vector, up to 300 Oe, with an accuracy of about 0.1 Oe should be measured.

Cost per sensing element must be low since a large number of sensing points is required.

It therefore is a further object of the present invention to propose an integrated sensor array employing the above defined improved novel characteristics and capable of measuring DC field distribution, the operation of such a one dimensional magnetic field sensor being based on the fact that magnetic bias field existing at a point of acoustic stress origin alters the acoustic stress, caused by a pulsed current due to the magnetostriction effect.

Another field of applications wherein the present invention may be advantageously employed is that of digitisers, i.e. digital output type coordinate readers, which are increasingly important to input graphics and characters being drawn on a sheet.

Digitisers of the prior art include electromagnetic induction, electrostatic, photoelectric, magnetostrictive ones, and so on. A digitiser requires a high-speed response process to handle diversified and highly densified information.

Many of the digitisers of the prior art have not found extensive applications for various reasons such as insufficient digitisation area accuracy, stability and reading durability, slow response speed and high cost.

Among the above mentioned digitisers of the prior art, those based on the magnetostrictive delay line technique are shown to be the ones accumulating most merits. However, in this field of digitisers based on magnetostrictive delay line techniques, there are still drawbacks.

By way of example, the digitiser proposed by Azuma Murakami (IEEE Transactions on Magnetics, Vol. 25, No. 3, May 1989) presents a resolution of the order of about 0.1 mm along the length of the magnetostrictive element, but is very poor in the other direction wherein the resolution depends on the dimensions of the employed coil. Therefore such a device can hardly be used as a two-dimensional digitiser.

Another digitiser proposed by E. Hristoforou (J. Appl. Physics, Vol. 70, 1991) whilst maintaining a resolution of the order of 0.1 mm in the longitudinal direction of the magnetostrictive element, presented in the other direction a resolution dependent on the width of the magnetostrictive delay line (less than 1 mm), but still less than what can be regarded as optimum.

It is therefore a further object of the present invention, to provide improvement in the performance of digitisers which will be based on the herein abovementioned small and large displacement sensors of the invention.

These and other objects, characteristics and merits of the present invention over the prior art will become apparent in the hereinafter analytical description, by reference to particular embodiments.

BRIEF DESCRIPTION OF THE DRAWINGS

The present invention will be made clearly apparent to those skilled in the art by reference to the accompanying drawings, wherein there are depicted illustrative embodiments of the invention.

FIG. 23(a) is a schematic diagram of an arrangement of a small displacement sensor array adapted to be used as a digitiser.

FIG. 24(a) is a schematic diagram of an arrangement of a large displacement sensor array adapted to be used as a digitiser.

The various parts and accessories in the present invention will be listed herein below in an arithmetic order same as that used in the accompanying drawings.

1. Magnetostrictive Delay Line (MDL).
2. Pulsed current conductor.
3. Exciting coil.
4. Receiving coil.
5. Soft magnetic cores.
6. Connecting element of two magnetic cores on either side of a magnetostrictive delay line.
7. Permanent magnets.
8. Long coil.
9. Cordless sensing pen used in a digitiser application.
10. Termination adhesive elements on either end of the magnetostrictive delay line.
11. Smoothly ended cordless pen used in a force sensor.
12. Effective delay line length in a force sensor based on reflections in the MDL.
13. Small field magnet optimizing the signal at either the point of origin or the receiving point of the delay line.
14. Support structure for the magnetostrictive delay line.
15. Magnetoresistive device.
16. Detecting magnetostrictive delay line.
17. Hard magnet array used for eliminating the output of an MDL in the absence of magnets 7 in the large displacement sensor of FIG. 17.
18. Sensing point of a two-dimensional finite force element.
19. A pair of magnetically soft active cores.
20. Ends of the magnetoresistive device 15.
21. Pulse width T measuring means, including a voltage threshold comparator.

DETAILED DESCRIPTION OF THE INVENTION

By reference to the accompanying drawings henceforth will be described illustrative preferred embodiments of the invention.

Figure 1:
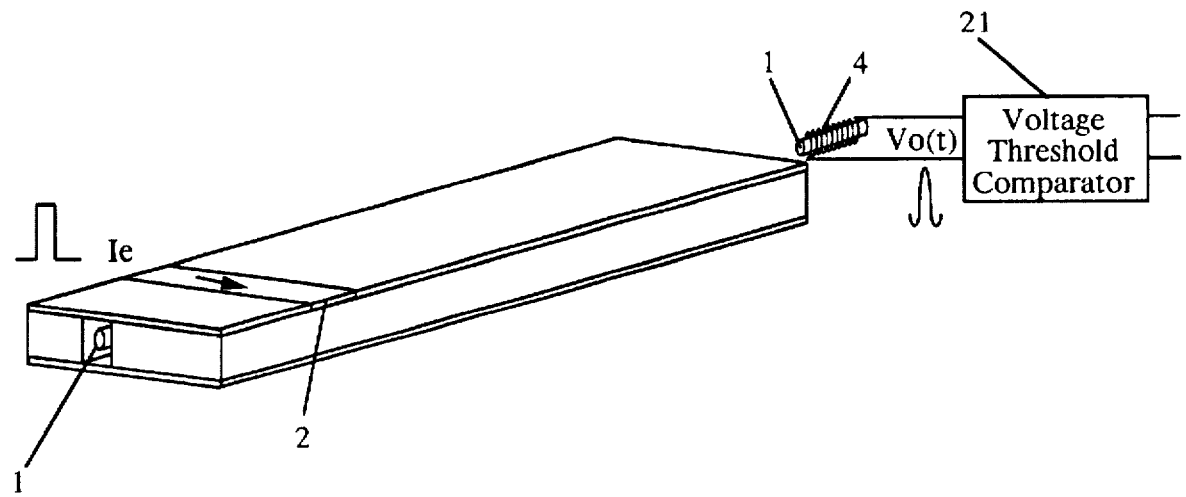
FIG. 1 shows an illustrative diagram of a basic set-up for the proposed magnetostrictive delay line, including a pulsed current conductor and a receiving coil as well as the pulse width T measuring means, which is a voltage threshold comparator.
Figure 2:
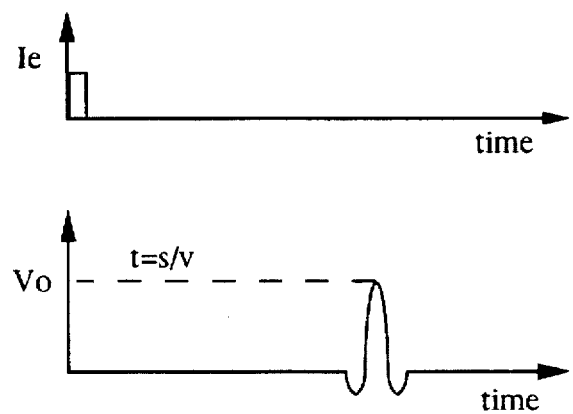
FIG. 2 shows an illustrative diagram of typical time response of the excitation current Ie and the received voltage output Vo for the illustrative magnetostrictive delay line of FIG. 1.

In FIG. 1 is illustrated the schematic of a magnetostrictive delay line (MDL) arrangement, which comprises the MDL 1, the exciting means, i.e. a pulsed current conductor 2, the receiving means, i.e. a receiving coil 4 and the pulse width T measuring means, i.e. a voltage threshold comparator 21. FIG. 2 illustrates the input and output of the typical MDL arrangement of FIG. 1, namely the excitation current Ie and the received voltage output Vo respectively.

Figure 3:
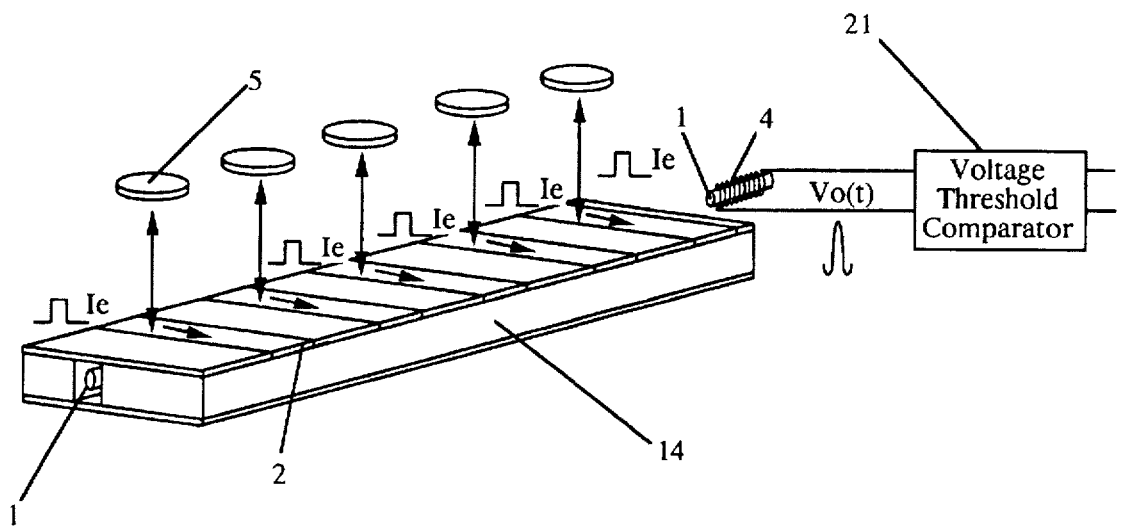
FIG. 3 shows the arrangement used in a first preferred embodiment of the small displacement sensors of the invention.
Figure 38:
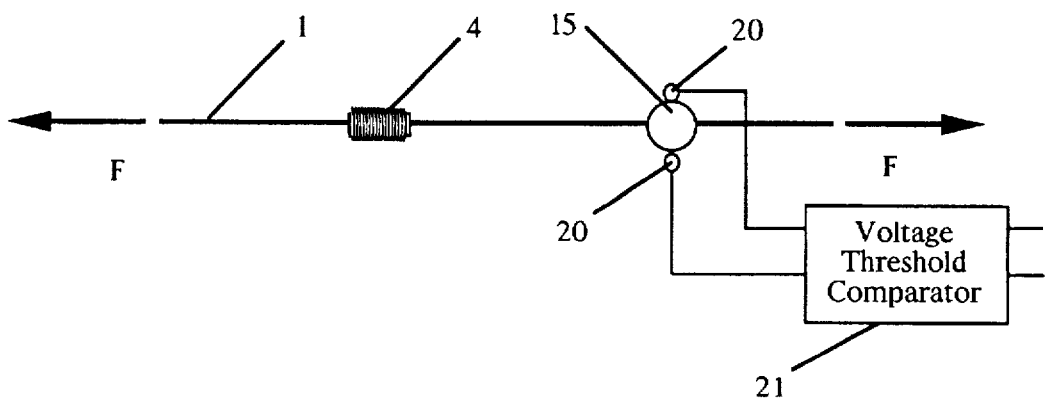
FIG. 38 shows the arrangement employed in a force sensor based on distortion of the acoustic signal, by exerting stress in the longitudinal direction of the delay line.

A sensor array in accordance with the present invention comprises, as by way of example is shown in FIG. 3, a plurality of sensors each of which comprises a sensing magnetostrictive delay line 1 which is made from a magnetostrictive material and extends from an acoustic stress point of origin which is defined as the point at which the MDL 1 crosses the pulsed current conductor 2, to a receiving point which is defined as the MDL region lying within the receiving coil 4. A pulsed current conductor 2 is provided at the point of origin and at right angles to the delay line 1, whereby a sensing point of the sensor array is defined at the crossing point of the pulsed current conductor 2 and the delay line 1. Means is provided for generating current pulses in pulsed current conductor 2 where this means may also be an exciting coil 3 which as depicted in FIG. 38 is located around the MDL at the acoustic stress point of origin.

Figure 44:
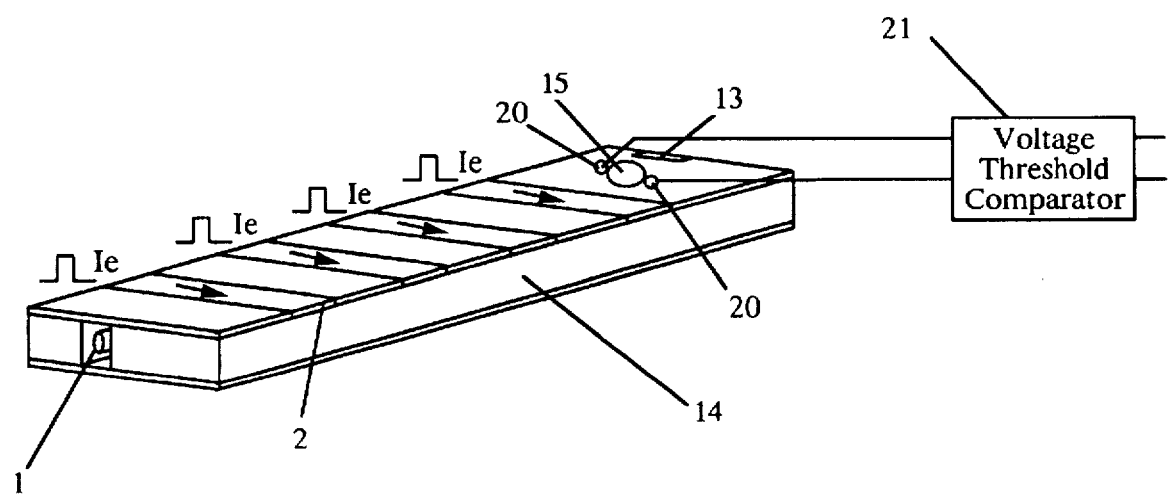
FIG. 44 shows an illustrative diagram of a basic set-up for the proposed magnetostrictive delay line, including a pulsed current conductor and in accordance with a preferred embodiment of the invention a magnetoresistive device at the output thereof.
Figure 45:
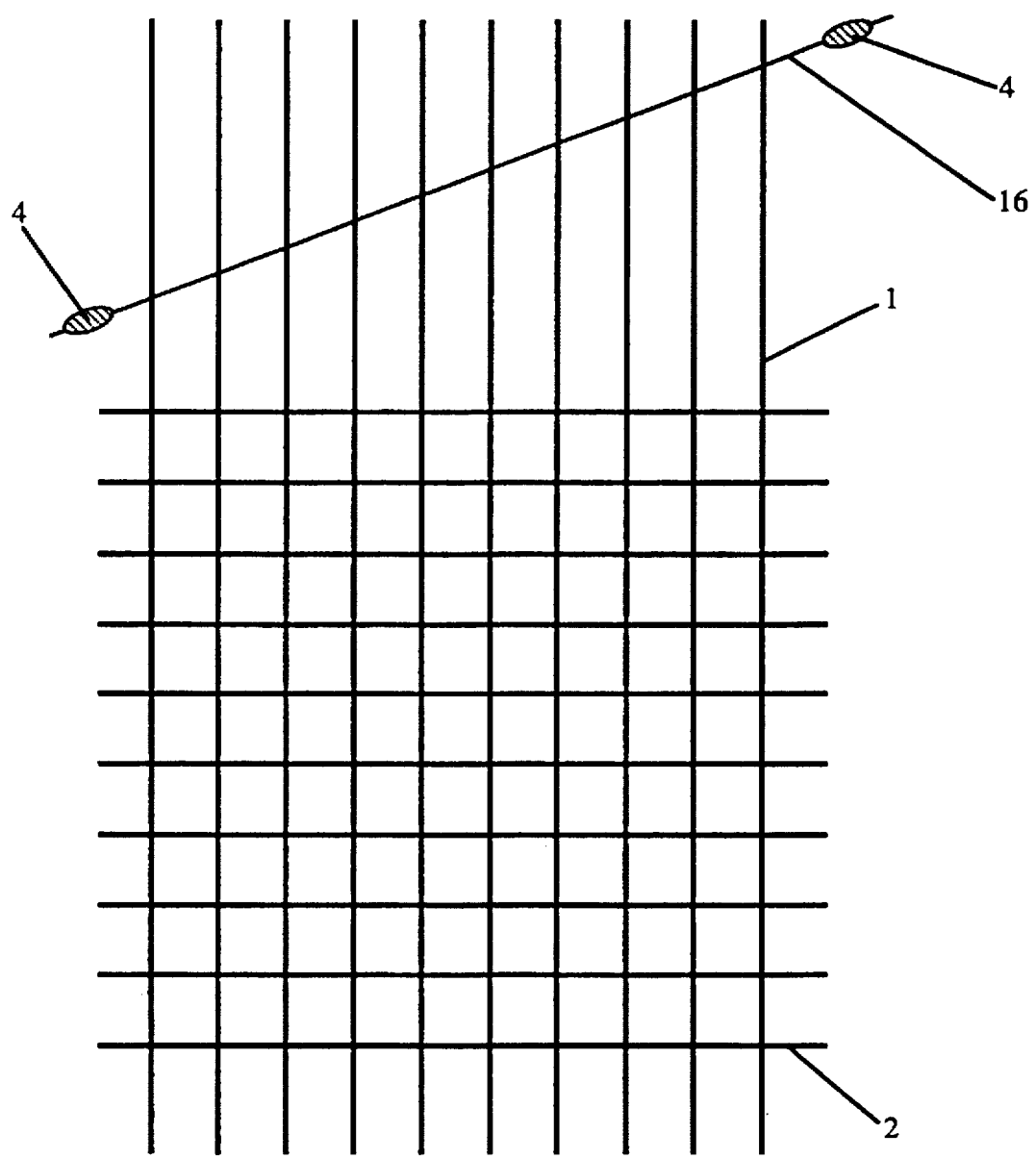
FIG. 45 shows an illustrative diagram of a basic set-up for the proposed magnetostrictive delay line, including a pulsed current conductor and in accordance with an alternative preferred embodiment of the invention a detecting magnetostrictive delay line with two coils at the output thereof.

Means is also provided for receiving a pulsed voltage output at the abovementioned receiving point of the magnetostrictive delay line 1, this means illustratively being a receiving coil 4. Alternatively and preferably the means for receiving the pulsed voltage output can be a magnetoresistive device 15 applied at the receiving point of the magnetostrictive delay line as shown in FIG. 44, whereas in accordance with another preferred embodiment of the invention this means may be a detecting magnetostrictive delay line 16 with two detecting coils at two ends thereof as shown in FIG. 45, where this detecting magnetostrictive delay line is preferably disposed at an angle of 45 degrees with respect to the array of sensing magnetostrictive delay lines.

A sensor array results when a means for changing the magnetic circuit at a sensing point is provided, this means operating so as to change a certain predetermined condition at such a sensing point, which can be located anywhere between the acoustic stress point of origin and the receiving point of the magnetostrictive delay line 1.

As has already been reported in the introduction to the present invention the various sensor arrays to be described hereinafter present certain important characteristics in the basic magnetostrictive delay line arrangement.

First, in accordance with the invention, the conventionally used detecting coils are replaced with either magnetoresistive devices 15 each having two ends 20, or by a detecting magnetostrictive delay line 16 with two detecting coils at two ends thereof, preferably disposed at an angle of 45 degrees with respect to the array of sensing magnetostrictive delay lines.

Figure 41:
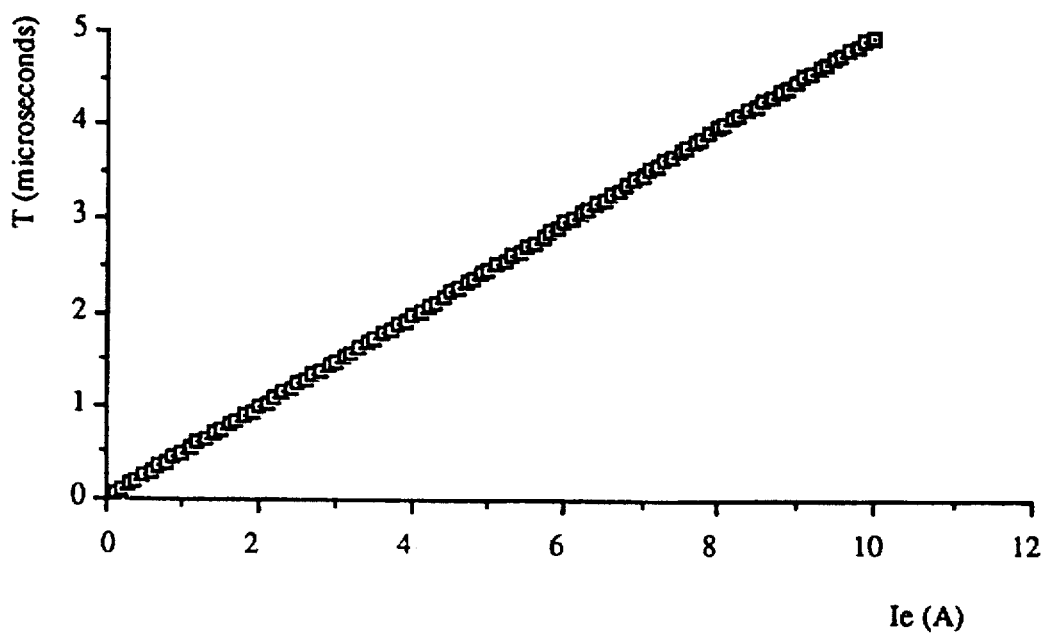
FIG. 41 shows a graph of the pulse width of the voltage output versus the transmitted pulsed current Ie.
Figure 42:
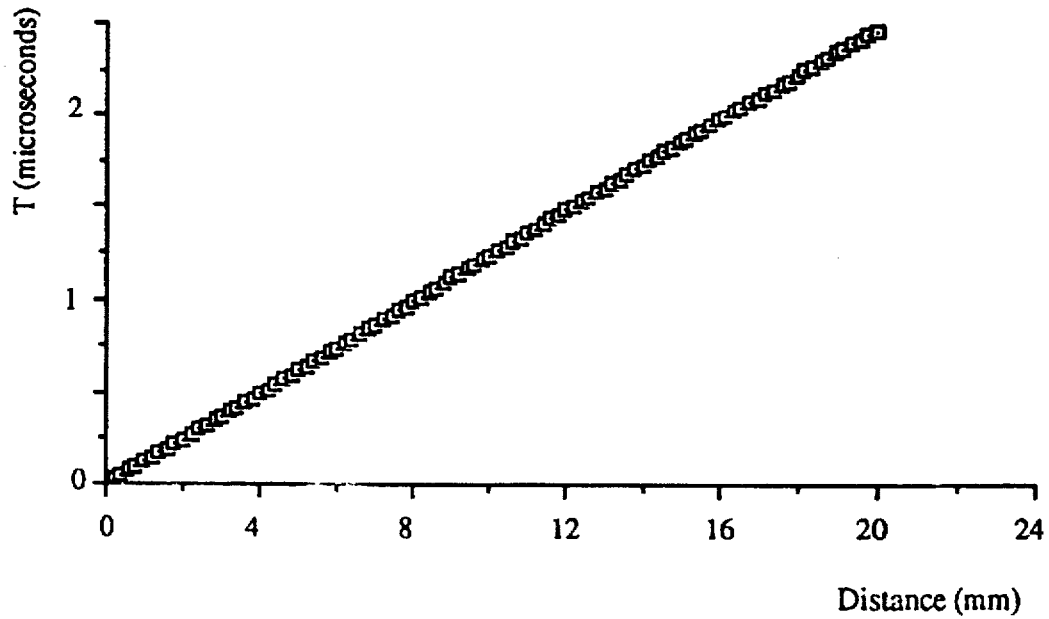
FIG. 42 shows a graph of the pulse width of the voltage output versus the distance of a moving hard magnet concerning the arrangement of FIG. 17.

Second, a voltage threshold comparator 21 is employed at the output of the magnetostrictive delay line as depicted in FIG. 1, to measure pulse width T instead of the conventionally monitored peak voltage output. This results in an improved linearity and uniformity of the response. Evidence for this is provided with FIG. 41 wherein a graph shows the pulse width of the voltage output versus the transmitted pulsed current Ie and FIG. 42 wherein a graph shows the pulse width of the voltage output versus the distance of a moving hard magnet from the acoustic stress point of origin, relating to the illustrative sensor arrangement depicted in FIG. 17.

Third, although using stress-current annealed magnetostrictive delay lines improves the behaviour of the latter, it is yet not satisfactory, since a degree of random behaviour can still be observed and this is certainly undesirable if the MDL technique is to be used for analog multiplexing. Thus, in accordance with the present invention, a normalization method is proposed, whereby all the measured values of the pulsed voltage output Voi and preferably the output pulse width Toi, i defining the ith excitation point, are divided by Vois or Tois respectively, where Vois or Tois is the maximum value of the pulsed voltage or pulse width output corresponding to the given sensing point. So during the operation of the delay line, any peak voltage or pulse width output Vo or To, when divided by the corresponding Vois or Tois, provides the normalized value Von (Ie) or Ton (Ie), where Von=Voi/Vois and Ton=Toi/Tois and a look-up table of the function previously stored could give the magnitude of Ie.

Depending on the condition that is varied and the means of varying this condition, a variety of array sensors results which will be discussed hereinafter.

In accordance with a first preferred embodiment of the invention the variable condition, by means of which the magnetic circuit at any point along the magnetostrictive delay line 1 is varied, is the displacement of the means for changing the magnetic circuit.

Various array sensors are proposed in the present invention, based on this variable condition.

One family of array sensors is proposed to measure distribution of displacement of objects on a surface, and is particularly adapted for using in the measurement of small displacement of objects along a surface, this displacement being of the order of 0–2 mm.

In this family of small displacement sensors the sensing technique is based on the change of the magnetic circuit at a sensing point, when changing the distance of an arrangement of soft magnetic cores from the sensing point, i.e. the crossing point of the magnetostrictive delay line and the pulsed current conductor. Various arrangements of movable soft magnetic core small displacement sensors are proposed and illustrated in the accompanying drawings.

In FIG. 3 is depicted a first preferred embodiment of the proposed small displacement sensor array, wherein an array of pulsed current conductors 2 is provided above a magnetostrictive delay line 1, and one soft magnetic core 5 is provided on top of each of the abovementioned pulsed current conductors 2, where the monitored displacement is the distance between each magnetic core 5 and corresponding pulsed current conductor 2.

Figure 3A:
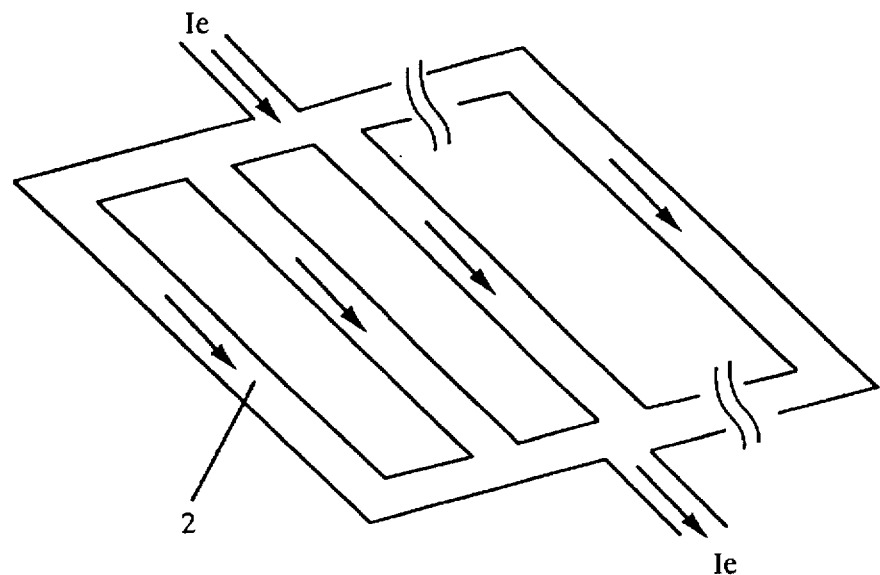
FIG. 3(a) shows a schematic diagram of the pulsed current conductor arrangement of FIG. 3.

FIG. 3(a) illustrates how the pulsed current is transmitted through the pulsed current array conductor. As all the pulsed current conductors have the same resistance, the current flowing through each one of the pulsed current conductors is the same. Assuming that the number of pulsed current conductors is n, then, transmitting a total amount of current Ie, the amount of current at each of the conductors equals Ie/n.

Figure 4:
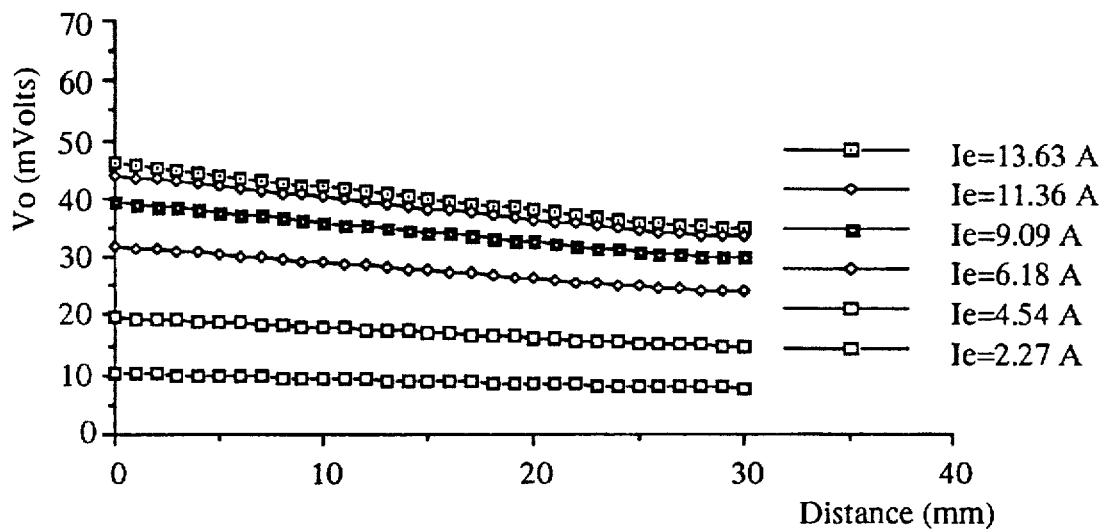
FIG. 4 shows the response of the sensor of FIG. 3 with a FeSiB as cast wire MDL.
Figure 5:
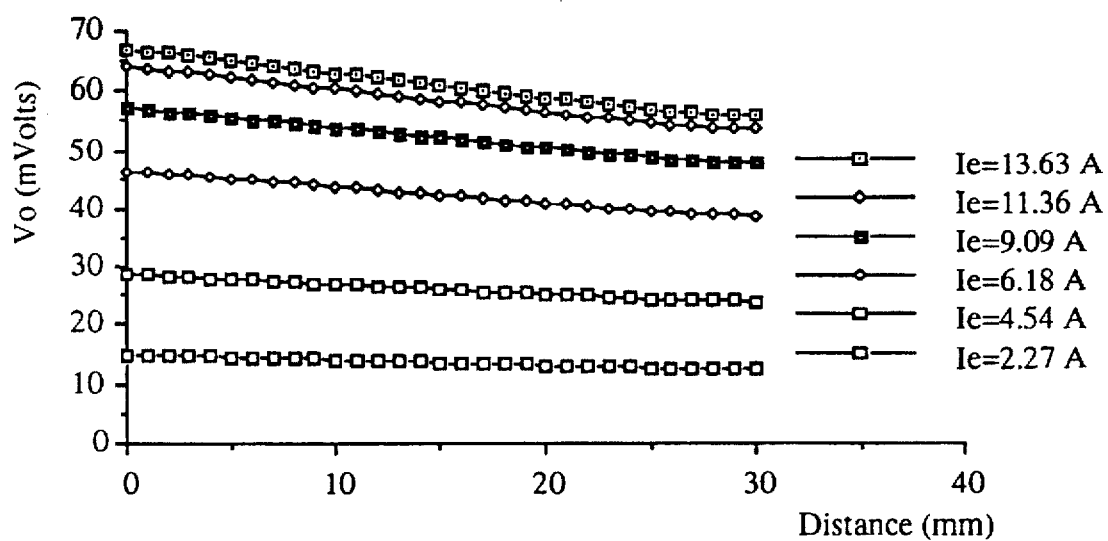
FIG. 5 shows the response of the sensor of FIG. 3 with a stress-current annealed wire MDL.

FIG. 4 shows the response of the sensor of FIG. 3 with a FeSiB as cast wire MDL, whilst FIG. 5 shows the response of the sensor of FIG. 3 with a stress-current annealed FeSiB wire MDL.

Figure 6:
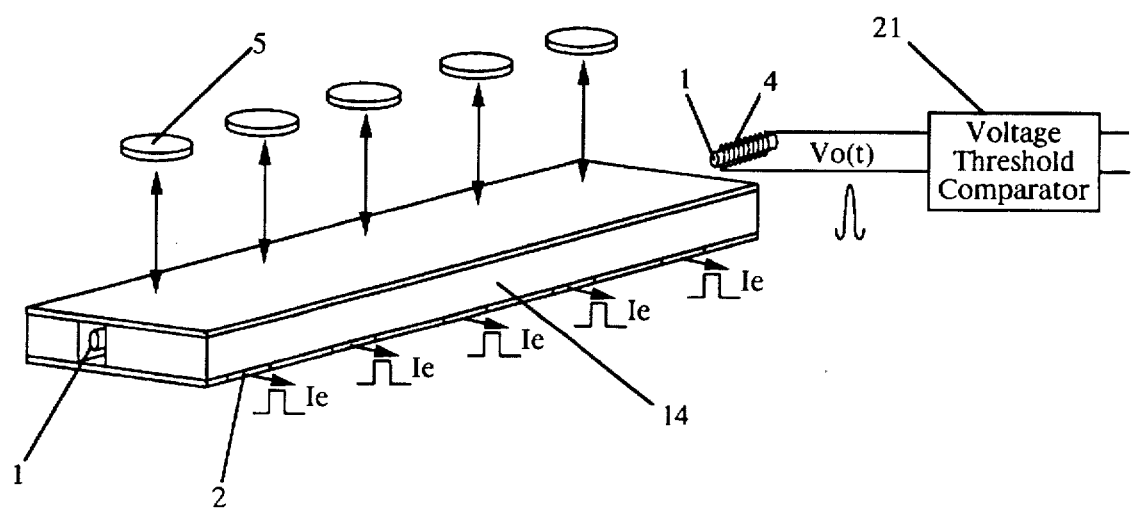
FIG. 6 shows the arrangement used in a second preferred embodiment of the small displacement sensors of the invention.

In FIG. 6 is depicted a second preferred embodiment of the proposed small displacement sensor array, wherein the array of pulsed current conductors 2 and the corresponding plurality of soft magnetic cores 5 is placed on opposite sides of the magnetostrictive delay line 1, in this case the monitored displacement being the distance between each soft magnetic core 5 and the magnetostrictive delay line 1.

Figure 7:
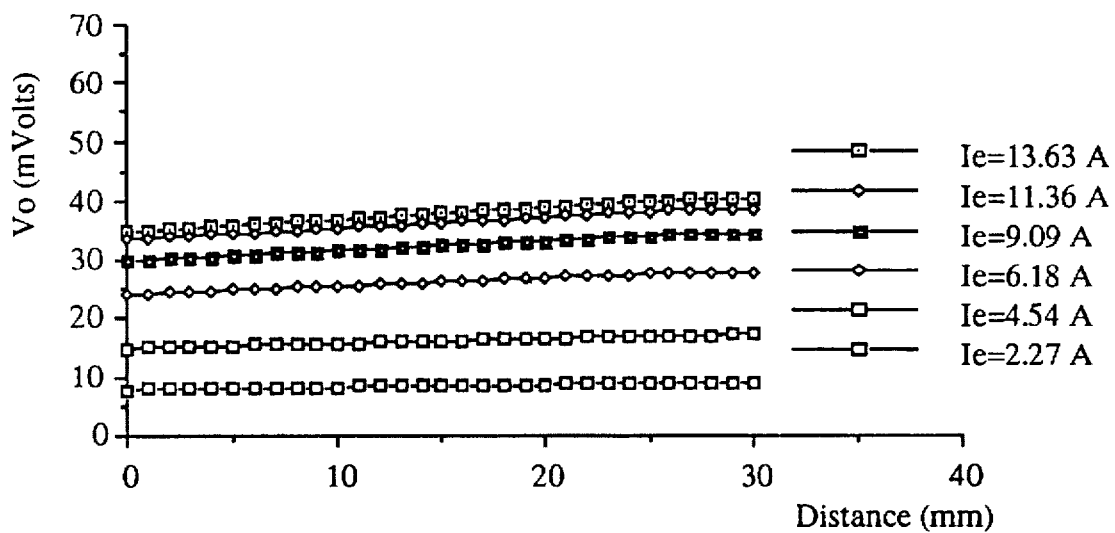
FIG. 7 shows the response of the sensor of FIG. 6 with a FeSiB as cast wire MDL.
Figure 8:
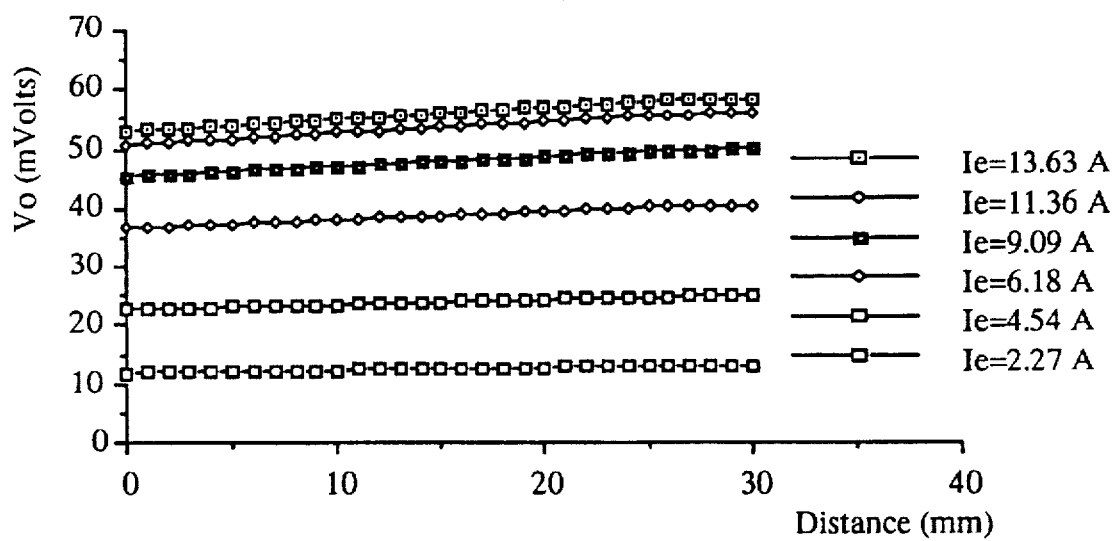
FIG. 8 shows the response of the sensor of FIG. 6 with a stress-current annealed wire MDL.

As shown in FIG. 6, a movable core made of Metglas 2605SC is placed close to the MDL-conductor arrangement. In the absence of this core the magnetic flux density in the acoustic stress point of origin is unchanged. If the core is present, magnetic flux density in the MDL is also related to it. Observing the arrangement, one can arrive at the following conclusion: the closer the core is to the delay line, the less magnetic flux exists in the delay line, i.e. better coupling between core and delay line is obtained, so that Vo decreases and the displacement of the active core could be calculated with respect to the detected output Vo. Graphs in FIGS. 7 and 8 show the response of this sensor with FeSiB as cast wire and stress-current annealed wire MDL respectively.

Figure 9A:
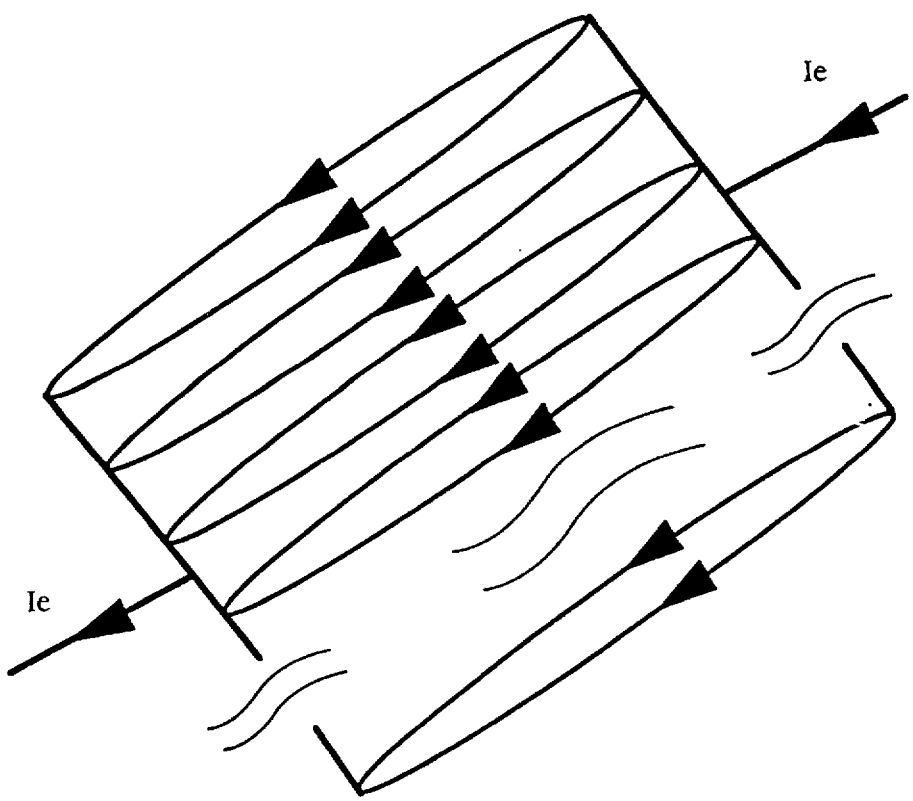
FIG. 9(a) shows a schematic diagram of the pulsed current conductor arrangement of FIG. 9, illustrating the current flow in a balanced structure embodiment.
Figure 9:
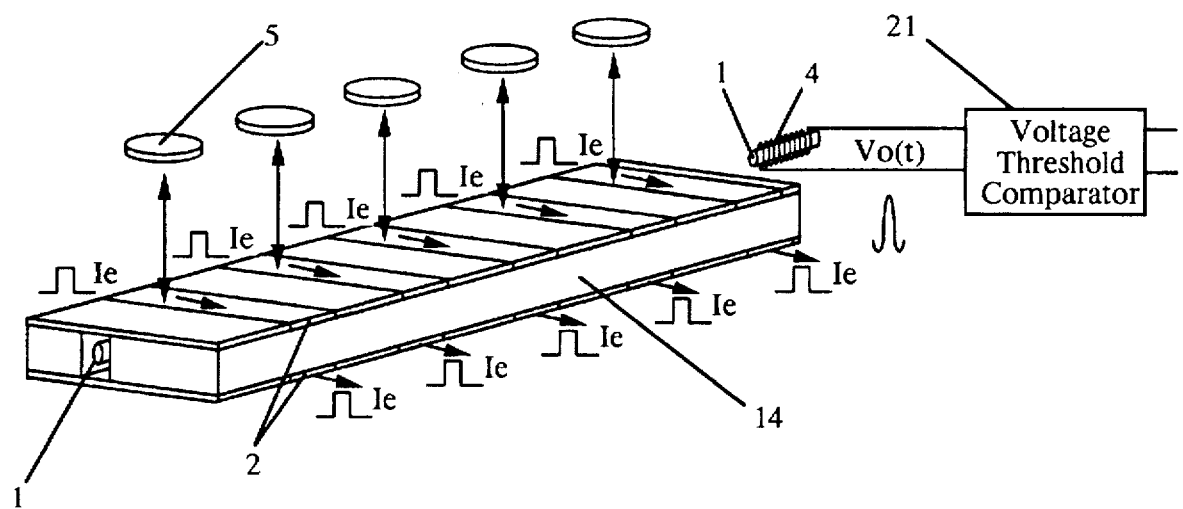
FIG. 9 shows the arrangement used in a third preferred embodiment of the small displacement sensors of the invention.

In FIG. 9 is depicted a third preferred embodiment of the proposed small displacement sensor array, wherein a first and a second series of pulsed current conductors 2 are provided on either side of the magnetostrictive delay line 1 located symmetrically on each side thereof, and a series of soft magnetic cores 5 is placed above one of the above mentioned series of pulsed current coductors 2, in this case the monitored displacement being the distance between each soft magnetic core 5 and the corresponding pulsed current conductor 2, located nearest to it.

Figure 10:
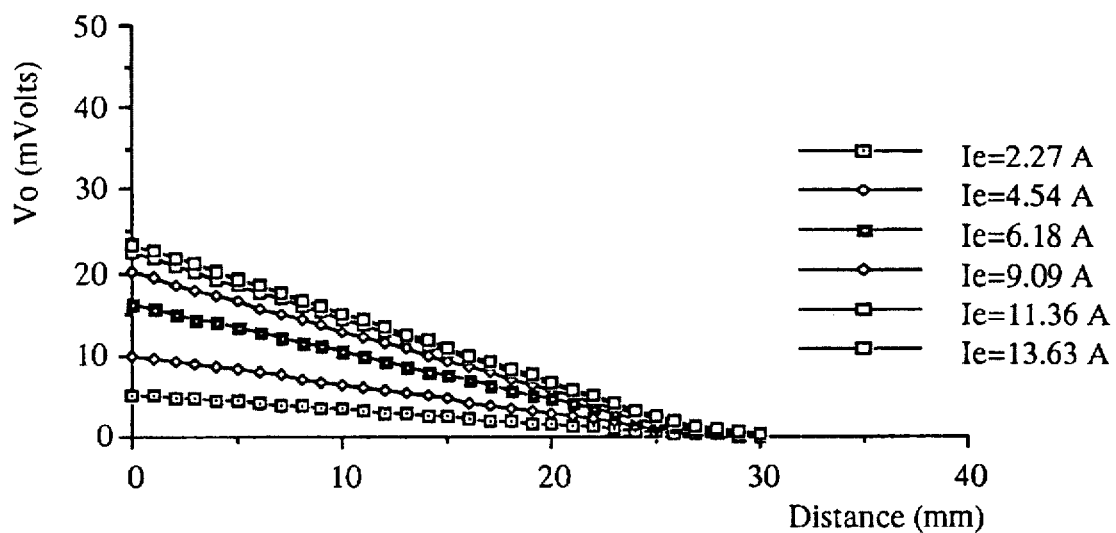
FIG. 10 shows the response of the sensor of FIG. 9 with a FeSiB as cast wire MDL.
Figure 11:
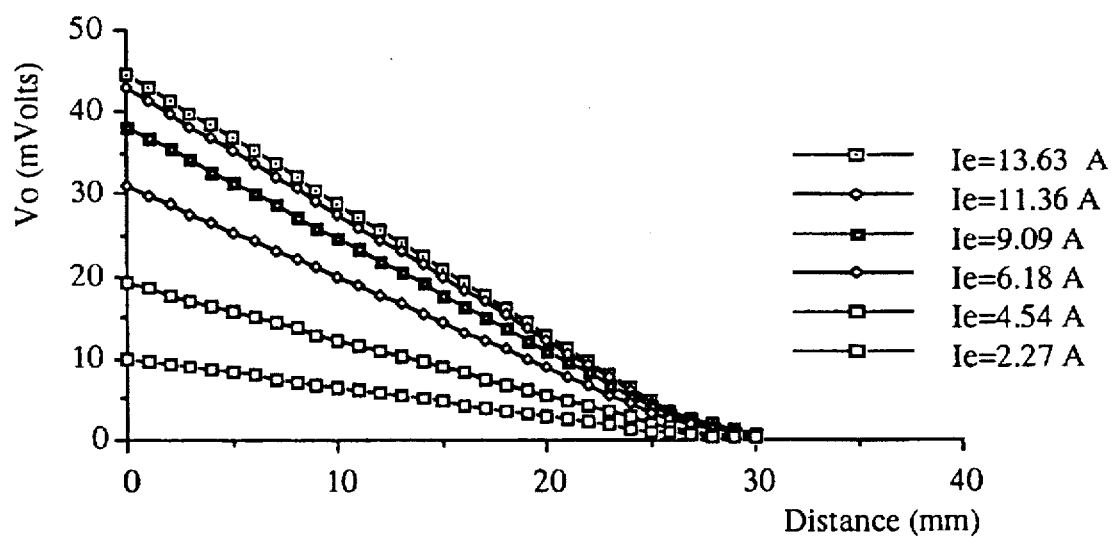
FIG. 11 shows the response of the sensor of FIG. 9 with a stress-current annealed wire MDL.

In FIG. 9, the conductors are joined together at their ends, so that the amplitude and direction of the pulsed current in both of them is the same. In the absence of the magnetic core 5, the magnetic field due to the conductor above the delay line, is opposing the magnetic field due to the one below the line. So, for an ideally symmetrical arrangement, the magnetic flux density at the point of origin in the absence of the core is always zero. If the active soft magnetic core is at a distance less than 2 mm, then magnetic coupling occurs and the resulting dependence of the output peak voltage Vo on the displacement of the active core is shown in FIGS. 10 and 11 for FeSiB as cast wire and stress-current annealed wire MDLs respectively.

FIG. 9(a) illustrates the schematic diagram of the pulsed current transmission above and below the MDL. The transmission and division of the pulsed current is the same as in FIG. 3(a). Additionaly, the pulsed current is divided into two equal amounts of pulsed current above and below the MDL. Hence, assuming a total amount of transmitted pulsed current Ie, having n pairs of pulsed current conductors, the amount of pulsed current at each one of the pulsed current conductors equals Ie/2n.

Figure 12:
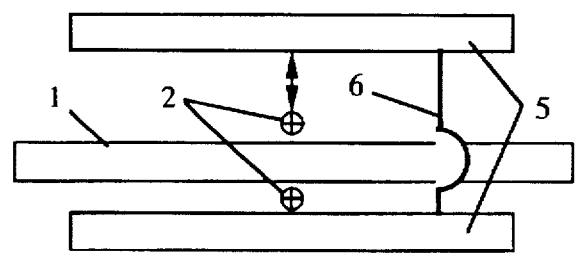
FIG. 12 shows the arrangement used in a fourth preferred embodiment of the small displacement sensors of the invention.

Finally, in FIG. 12 is depicted a fourth preferred embodiment of the proposed small displacement sensor array, wherein a first and a second series of pulsed current conductors 2 are provided located symmetrically above and below the magnetostrictive delay line 1 and a corresponding first and second array of soft magnetic cores 5 are provided on either side of the pulsed current conductors, wherein the two arrays of soft magnetic cores are interconnected by means of connecting elements.

Figure 13:
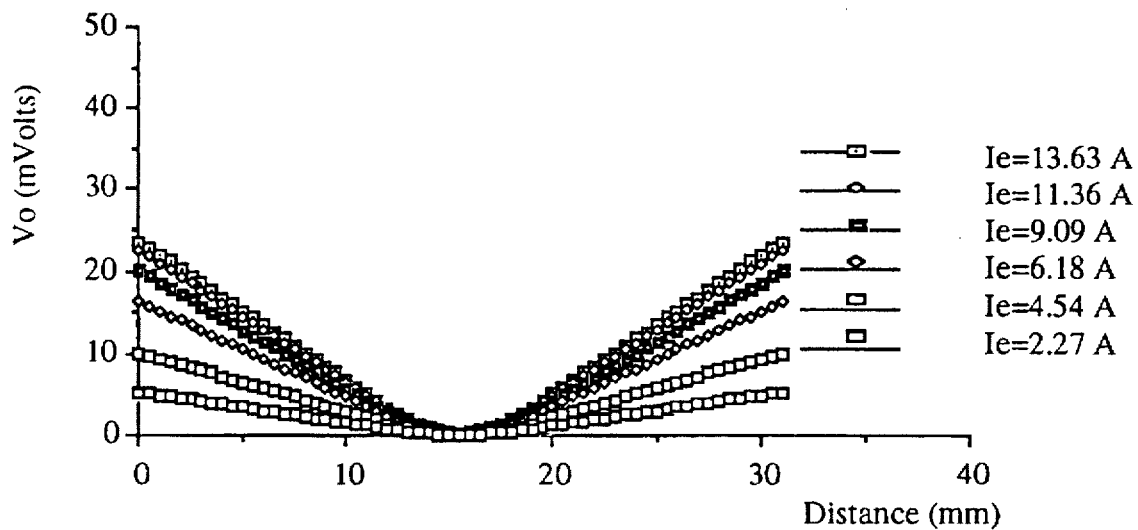
FIG. 13 shows the response of the sensor of FIG. 12 with FeSiB as cast wire MDL.
Figure 14:
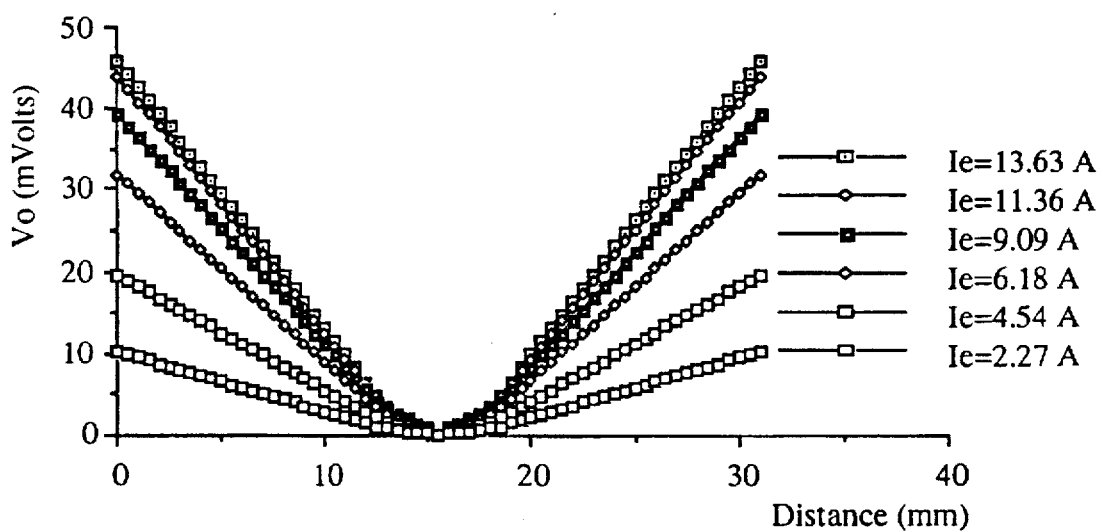
FIG. 14 shows the response of the sensor of FIG. 12 with a stress-current annealed wire MDL.
Figure 15:
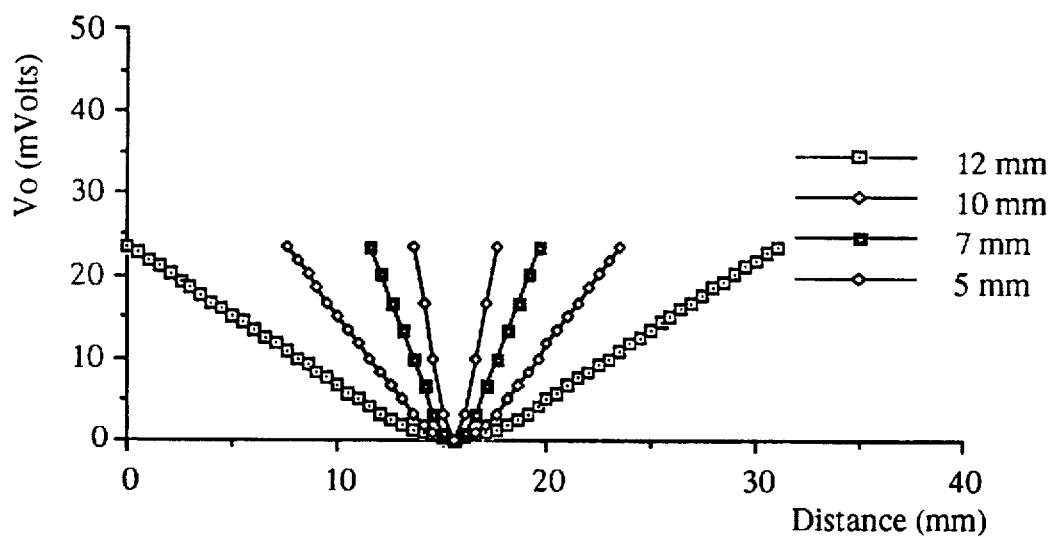
FIG. 15 shows the response of the sensor of FIG. 12 using a FeSiB as cast wire MDL under various gaps between the active cores.
Figure 16:
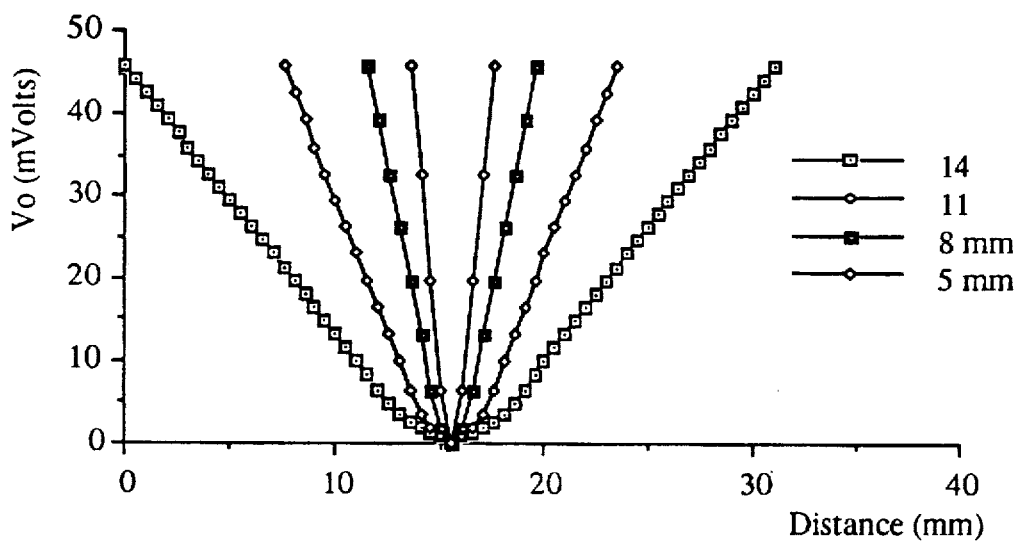
FIG. 16 shows the response of the sensor of FIG. 12 using a stress current annealed wire MDL, under various gaps between the active cores.

In this case of FIG. 12, two active cores are used, which are above and below the MDL respectively and are joined together in order to keep their distance fixed. When no displacement is applied, the cores are at their maximum and minimum distance from the MDL respectively. Both magnetic cores are involved in altering the resulting Vo. As the balanced structure of FIG. 9 is also used here, Vo becomes zero when the distance between each one of the cores and the delay line is equal. The gap between the two cores results in changes of the performance of the sensor, as illustrated in FIGS. 15 and 16 for FeSiB as cast wire and stress-current annealed wire MDLs respectively. Graphs in FIGS. 13 and 14 illustrate the response of this sensor with FeSiB as cast wire and stress-current annealed wire MDL respectively.

It must be noted that any of the above described sensors exhibits a maximisation of the acoustic pulse and of the receiving voltage, when a small field magnet 13 is placed close to the acoustic stress point of origin and the receiving point respectively.

To obtain graphs providing the behaviour of each of the above described embodiments of small displacement sensors, the experimental results were obtained with the delay line placed within a rectangular cross section channel, a micrometer device being used to displace the magnetic core. All precautions were taken to obstruct any possible interference to the monitored magnetic circuit, i.e. the magnetic circuit corresponding to the monitored displacement, which is the distance between the magnetic core and the closest point of the delay line—pulsed current conductor assembly. The experimental results were taken by decreasing and subsequently increasing the monitored displacement. The reported output was the same for both cases, that being an indication that hysteresis was absent.

The above described family of small displacement sensors can find various applications, such as by way of example tactile arrays, devices for medical applications or digitisers.

Hereinbelow will be described an illustrative embodiment of the invention, wherein the above described sensor array depicted in FIG. 9 is adapted to work as a digitiser. In this application a single sensing core is employed, this core being a cordless sensing pen with a soft magnet at the edge thereof, moving close to the array of MDL and pulsed current conductors, the output of all the MDL-conductor crossing points in the neighbourhood of the cordless sensing pen being used to indicate the position of the sensing core, whilst the method employed comprises the following steps:

1. We detect the non-zero pulsed voltage outputs Voij, out of the respective points Aij.
2. We then divide the values of pulsed voltage by the weight factor Wij. Weight factors are defined as the maximimum possible outputs at a given crossing point, so the resulting Vonij (Vonij=Voij/Wij) is the normalised value of the given crossing point Aij.
3. Comparing the magnitudes Vonij with the array of the normalised values Von(X), which is one and only one for each one of the crossing points of the array sensor, and which is stored in a EEPROM chip, we get to know the distances Xij between the sensing pen (cordless sensing pen core) and the crossing points.
4. In this way we firstly determine the area in which the sensing core is located, which is the rectangular area (ABCD) defined by the four points where the corresponding Vonij values are the maximum ones, forming necessarily a rectangular arrangement, as shown in FIG. 23 and FIG. 24.

Figure 23:
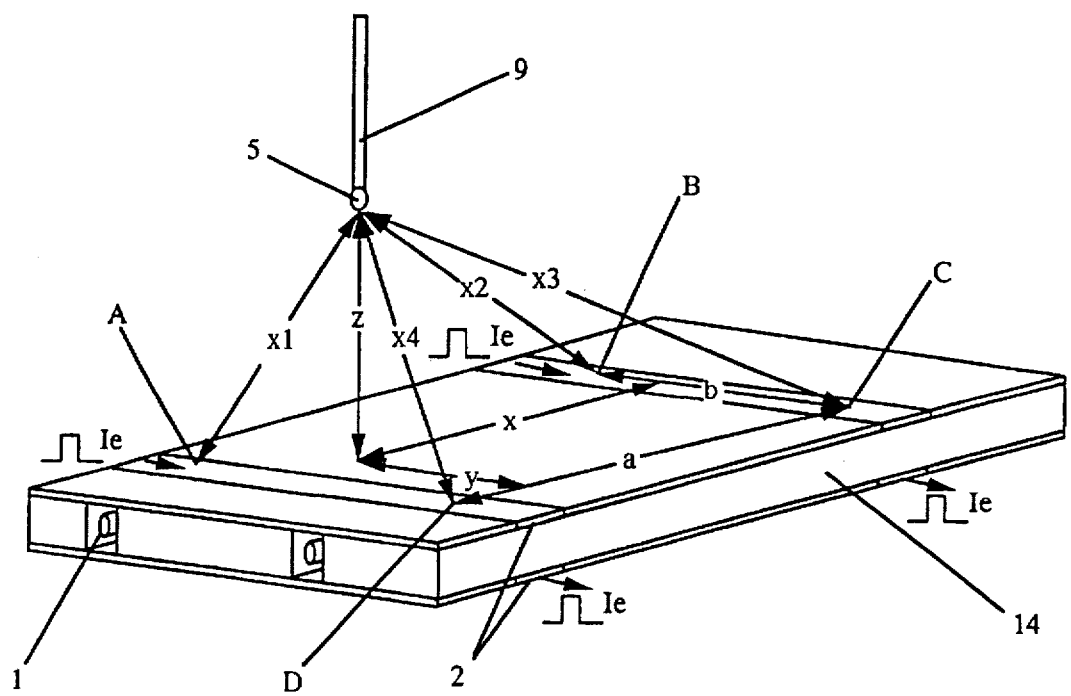
FIG. 23 is a detailed view of an arrangement of a small displacement sensor array adapted to be used as a digitiser.
Figure 24:
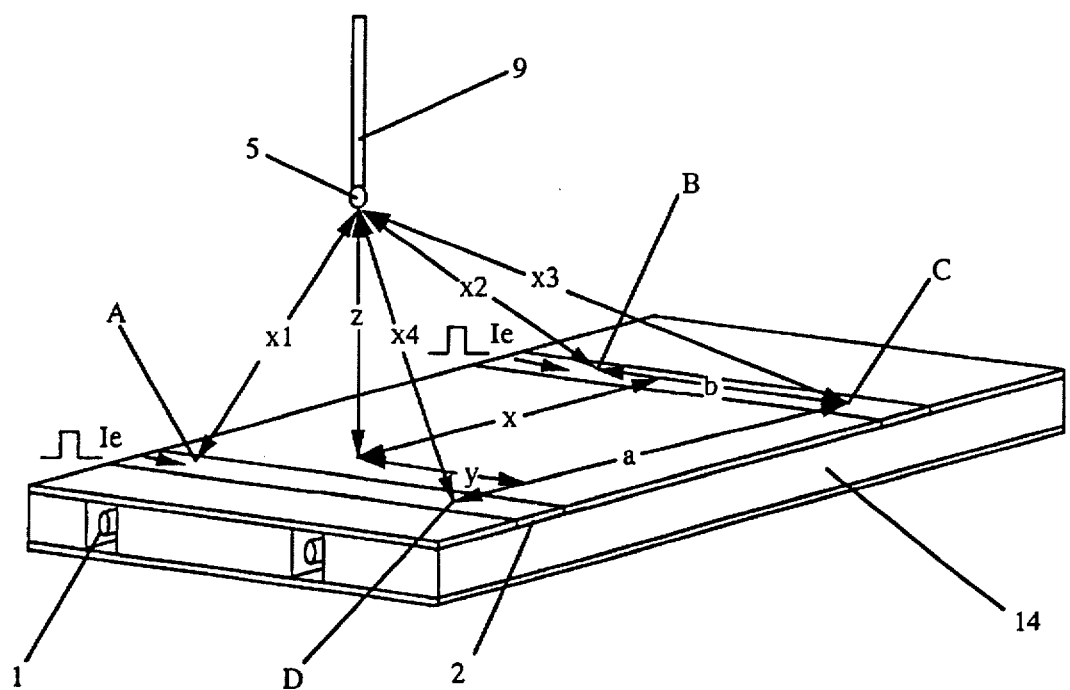
FIG. 24 is a detailed view of an arrangement of a large displacement sensor array adapted to be used as a digitiser.
Figure 23:
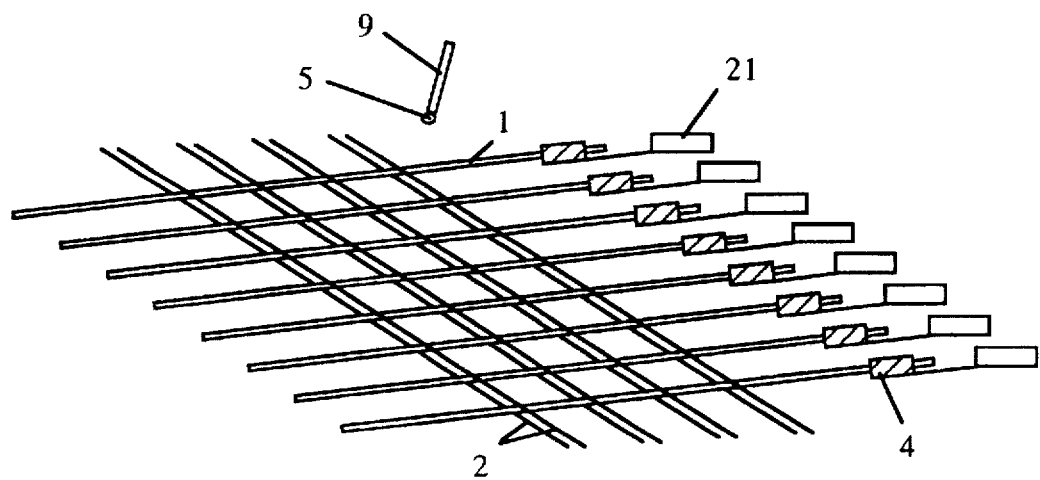
Figure 24:
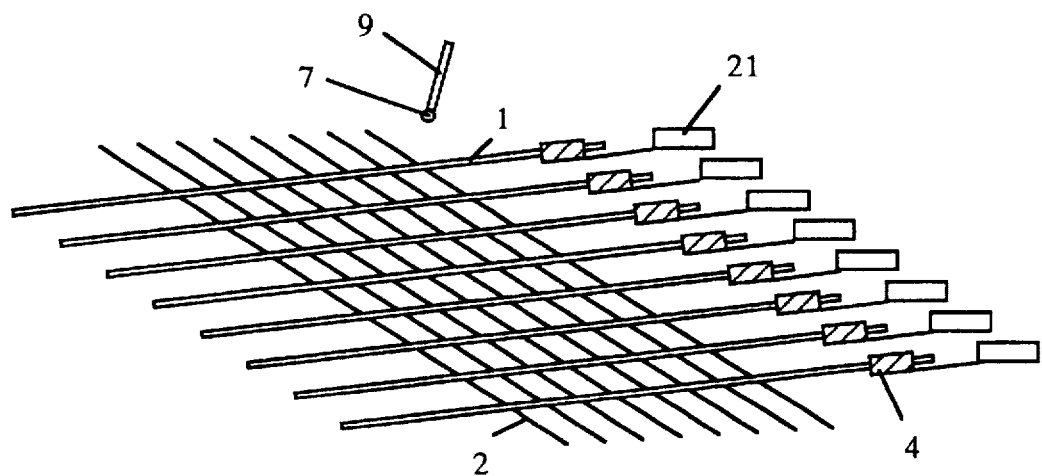

FIGS. 23 and 24 show a detailed view of an arrangement of a small and a large displacement sensor array respectively, adapted to be used as a digitiser. In this digitiser application, the abovementioned rectangular area (A B C D), defined by the four points where the corresponding Vonij values are the maximum ones, is used to indicate the position of the sensing core, i.e. of the abovementioned cordless sensing pen with a magnet at the edge thereof, which is moved close to the array of MDL and pulsed current conductors.

5. After finding the four crossing points A,B,C,D, the exact position of the core is found as follows:

In order to make the presentation and understanding of following equations simpler, we define the corresponding Xij as X1, X2, X3 and X4 as shown in accompanying FIG. 23 and FIG. 24, from which it is concluded that:

$$X1^2=Z^2+Y^2+(a-X)^2$$

$$X2^2=Z^2+X^2+Y^2$$

$$X3^2=Z^2+(b-Y)^2+X^2$$

$$X4^2=Z^2+(b-Y)^2+(a-x)^2$$

It becomes obvious that X, Y and Z, which define exactly the position of the sensing core can be calculated from the following equations:

$$X = \frac{a^2 - (X1^2 - X2^2)}{2a}$$

$$Y = \frac{b^2 - (X3^2 - X2^2)}{2b} \text{ and}$$

$$Z = X2^2 - X^2 - Y^2$$

Hence, X, Y and Z (and consequently the exact position of the sensing pen) are well defined, accuracy of detection depending only on the counting means of the user.

Although the above described group of small displacement sensors have proved satisfactory in the measurement of displacement confined in the range of 0–2 mm, if the need arises to measure larger displacement, they are not appropriate, since their sensitivity vanishes. Thus, another family of array sensors is proposed in accordance with the present invention, to measure distribution of objects on a surface, such a sensor array being particularly adapted for using in the measurement of large displacement of objects along a planar surface, this displacement being of the order of 2–20 mm.

In this group of large displacement sensors the sensing technique is based on the change of the peak voltage output Vo, due to the change of the DC magnetic field at the point of origin of the acoustic stress and the receiving point respectively, change being obtained with the moving magnetic technique. The abovementioned DC magnetic field is created by the permanent magnets 7.

Figure 17:
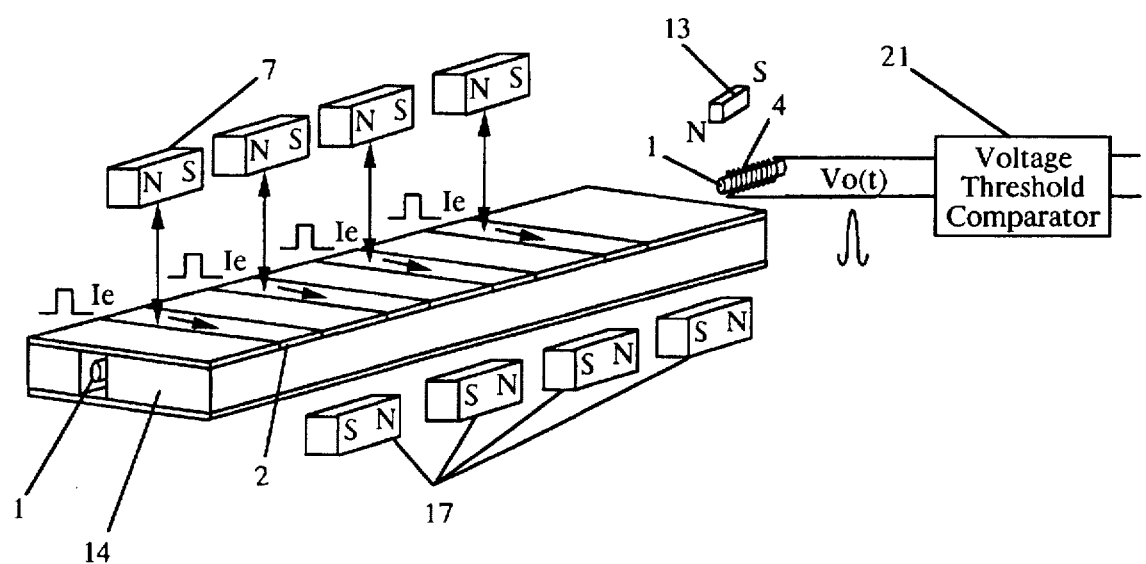
FIG. 17 shows the arrangement used in a first preferred embodiment of the large displacement sensors of the invention.

In FIG. 17 is depicted a first preferred embodiment of the proposed large displacement sensor array, wherein an array of pulsed current conductors 2 is provided at right angles to the delay line 1, thereby creating its sensing points. Movable magnets of permanent magnetic material 7 are positioned on top of these sensing points and their displacement causes a change of Vo, due to the DC bias effect at the point of origin, whereas an array of hard magnets 17 is set below the MDL-conductor array to eliminate the output of the MDL in the absence of the above mentioned magnets 7.

The magnets are arranged so that their field is in the same direction as the pulsed magnetic field. According to this arrangement, when pulsed current is transmitted through the exciting conductor, the magnitude of the acoustic pulse and consequently the detected peak voltage is dependent on the distance of the magnet from the point of origin. This operation can be explained as follows: as the magnitude of the magnetic field around the magnet is fixed, the DC magnetic field and flux in the MDL are dependent on the distance between magnet and MDL. A small field magnet 13 is preferably fixed at the receiving point, in order to maximize the voltage output.

Figure 20:
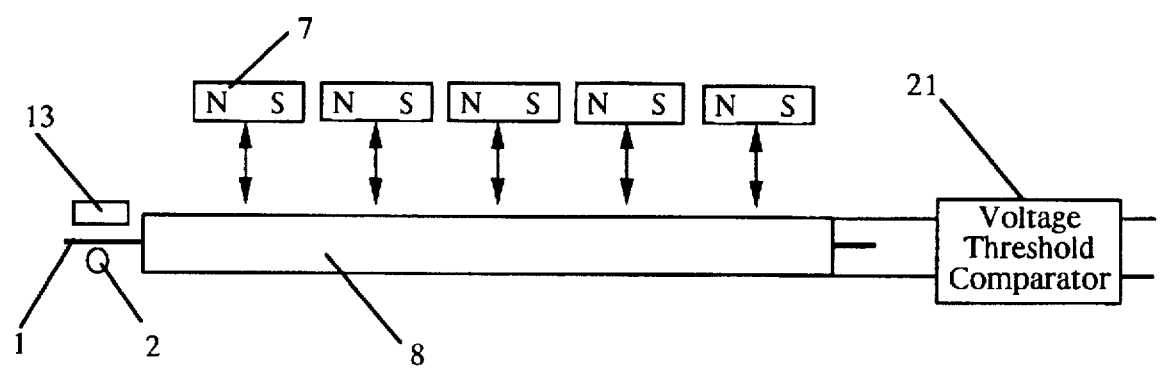
FIG. 20 shows the arrangement used in a second preferred embodiment of the large displacement sensors of the invention.

In FIG. 20 is depicted a second preferred embodiment of the proposed large displacement sensor array, the operation of which is based on the DC bias effect at the receiving coil and the inverse magnetostriction effect. A pulsed current conductor 2 is orthogonal to the MDL 1. A long coil 8 is around the MDL and an array of movable, small field magnets 7 is on top of the long coil 8 defining thus the sensing points of the integrated array. The way to set-up this array is the same as for the previous sensor. A small field magnet 13 is also preferably positioned at the point of origin, in order to maximize the detected response. This operation runs as follows: the MDL is excited by the pulsed current and the caused acoustic stress propagates in the MDL, henceforth being detected as a train of pulses at the output of the long coil 8. These pulses are caused at the sensing points due to the presence of the magnets 7. The magnitude of these pulses is dependent on the distance of the magnets from the MDL. The closer the magnet is to the delay line, the greater the magnitude of DC field in the MDL at the sensing point is. The distance between successive magnets must be sufficient, i.e. of the order of 8 cm, in order to avoid any mixing of the localized magnetic fields. The displacement of the small field magnets with respect to the MDL and the resulting peak value Vo are the input and output respectively of these two types of displacement distribution sensors.

Figure 18:
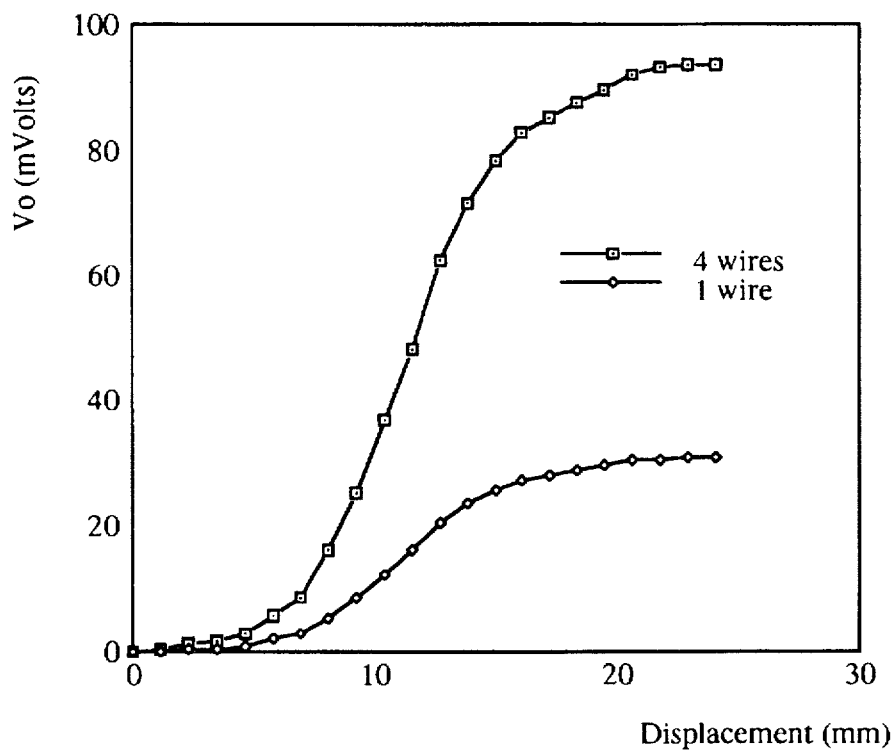
FIG. 18 shows the response of the sensor of FIG. 17 with FeSiB as cast wire MDL.
Figure 19:
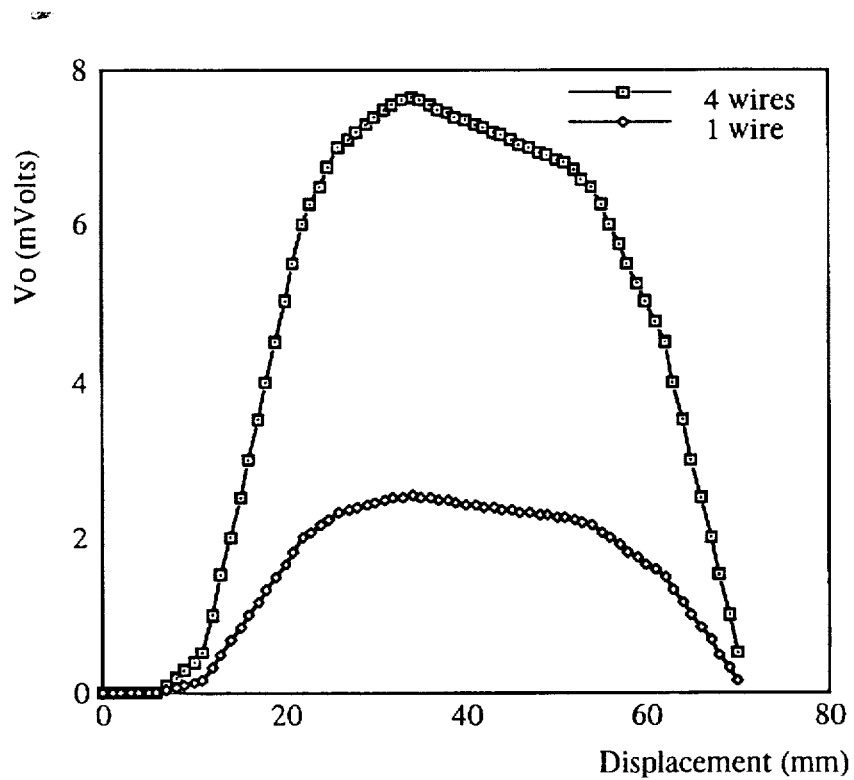
FIG. 19 shows for the sensor of FIG. 17 graph of the peak voltage output Vo versus distance of the moving magnet from the receiving point for different values of the excitation current Ie, in the case of as cast FeCoCrSiB amorphous wire.
Figure 21:
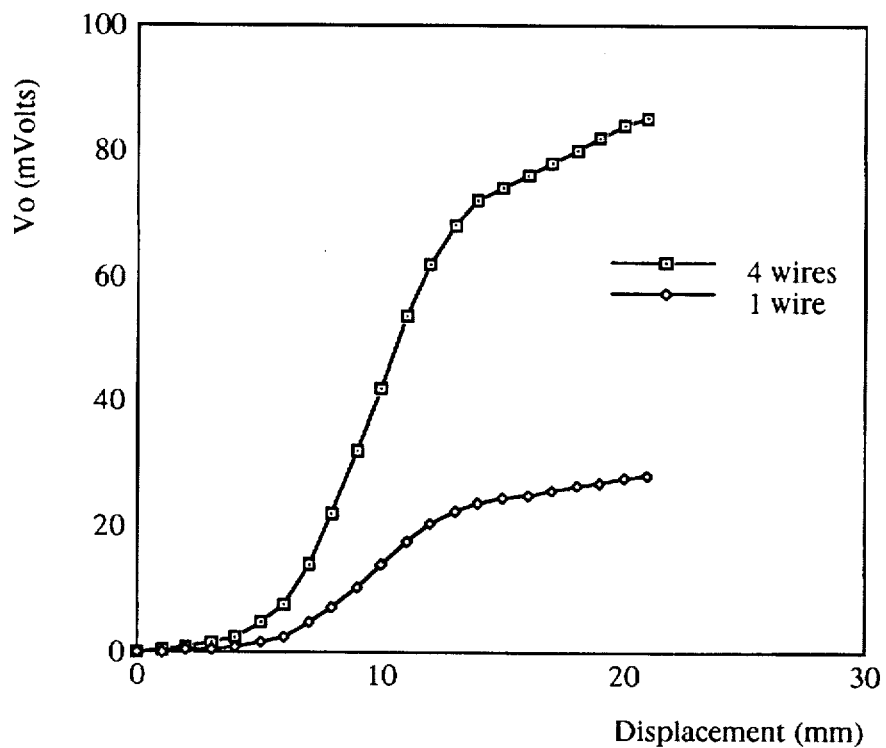
FIG. 21 shows the response of the sensor of FIG. 20 with FeSiB as cast wire MDL.
Figure 22:
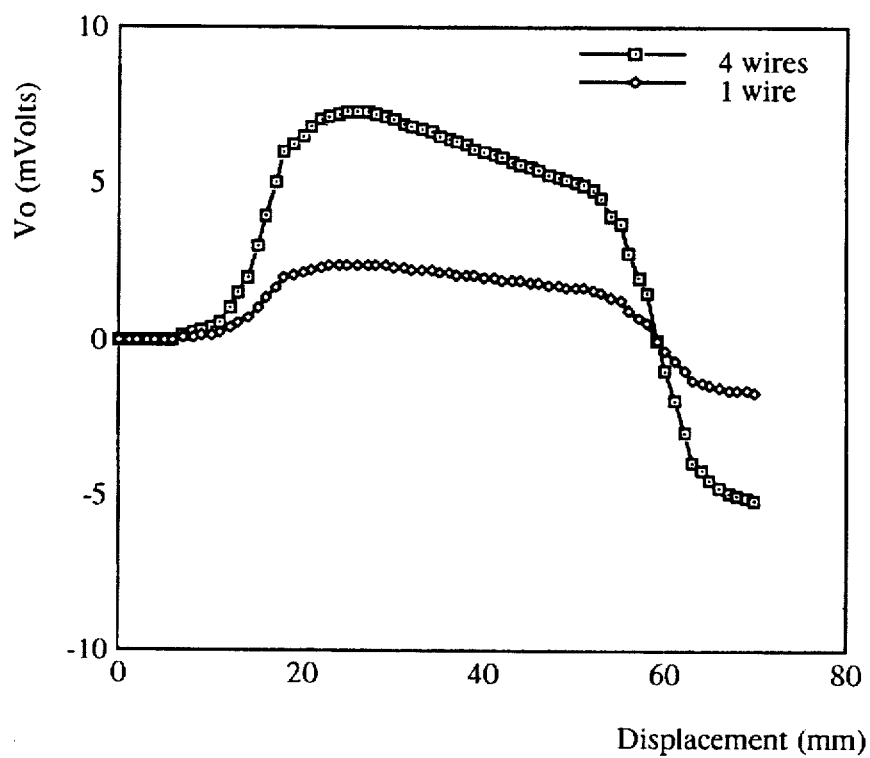
FIG. 22 shows for the sensor of FIG. 20 graph of the peak voltage output Vo versus distance of the moving magnet from the point of origin for different values of the excitation current Ie, in the case of as cast FeCoCrSiB amorphous wire.

The response of the two sensors was taken for various values of applied pulsed current peak values Ie and the results when FeSiB as cast wire MDL is used are shown in FIGS. 18 and 21, concerning the set-ups of FIGS. 17 and 20 respectively. Experimental data were taken by increasing and decreasing the distance between moving magnet and MDL. The resulting curves were the same, this being an indication that the hysteresis factor is small for these types of sensors. The response of the two sensors of FIGS. 17 and 20 for various values of applied pulsed current peak values Ie was also measured with FeCoCrSiB amorphous wire MDL and the results are respectively shown in FIGS. 19 and 22.

A monotonic response of these sensors was measured for displacement up to 20 mm, for both the above sensors. Thus, these sensors could be regarded as large-displacement distribution ones. It is noted that in order to keep the response of these sensors monotonic, we have to maintain the maximum distance between moving magnet and MDL, to be less or equal to 20 mm.

From FIGS. 18 and 21 it is observed that the response of the displacement sensors is monotonic, even if the moving magnet is far away from the sensing point. This effect can be explained by observing the typical microstrain function of soft magnetic ribbons and wires. This behaviour is unlike the one using Ni or other crystalline magnetostrictive wires because in that case the response is not monotonic, which makes them useless for the purpose of using them as MDLs in array sensors. On the other hand, the saturating field is very close to the earth's magnetic field, so that Metglas or FeSiB wires can very easily be in saturation. In addition to that, it should be better to use high magnitudes of pulsed magnetic field in order to make sure that no errors are to be introduced due to arbitrary changes from positive to negative saturation magnetization.

There is an indication that by using FeSiB wires the resulting nonuniformity is much less (after stress-current annealing) compared to the already used ribbon delay lines and on the other hand their use could simplify the manufacturing process, as it is easy to find 0.5 mm internal diameter plastic tube for support of the delay lines and/or the receiving coils.

The sensing points' resolution of the herein described large displacement array sensors (moving magnet sensors) can be up to a few cm (20 and 80 mm for the case of the sensors of FIGS. 17 and 20 respectively) along the length of the line, while a higher degree of resolution could be obtained in the other dimension, due to the newly developed FeSiB wires.

On the other hand, if in accordance with another preferred embodiment of the invention another array of delay lines-long coils is used, positioned orthogonally to the first one, the resolution increases in the other dimension as well. Obviously, the same pulsed current conductor can be used, turned 90 degrees to excite the second array of lines.

The number of the soldering connections which must be done has been reduced down to a number of the order of the number of delay lines. For the moving magnet sensors utilising long receiving coils, soldering connections are needed only for the existing pulsed current conductors (which is just one, for the long receiving coil sensor). So with respect to the possible use of the FeSiB wires (easily achievable long substrates for the long coil), the cost of the transducers could be significantly reduced.

An interesting property of these sensors is the ease of correcting the nonuniformity due to normalization process before any use, and the fact that no calibration against external magnetic field is needed since it could be obtained by the moving magnet itself.

The above described first embodiment of this family of large displacement sensors (FIG. 17) can easily be made and the manufacturing process could be divided into two parts:

Making the delay line support, which is done in a conventional way and

Making the sensing points. This can be done by using a movable mat (foam) and flexible arrays of magnets.

In manufacturing the above described second embodiment (FIG. 20) of this family of large displacement sensors, the most important problem is the structure of the long receiving coils.

Reducing the cost of manufacturing of the long coils can be obtained by using low longitudinal uniformity windings, since normalization process can be used for reading corrections.

On the other hand it is obvious, that for such a sensor we can make use of an array of m delay lines-long coils which are to be excited by the same pulsed current conductor and could be close to one end of the delay line. For the case of an m×m sensing points array based on discrete sensing devices (e.g. strain gauges), we need 2×m×m solderings for the whole transducer sensing area.

Using the small displacement sensors and the sensor depicted in FIG. 17 we need m+1 solderings, while for the sensor of FIG. 20 we need just 2.

The above described family of large displacement sensors can find various applications, among which herein below will be described an illustrative embodiment of the large displacement sensor array of FIG. 17 adapted to be used as a digitiser. In this application a single sensing core (cordless sensing pen) is employed, the output of all the MDL-conductor crossing points being used to indicate the position of the sensing core, whilst the method employed comprises the following steps:

An array of hard magnets 17 is set below the MDL-conductor array, so that the output of all the crossing points vanishes. When the cordless pen, having a hard magnet oriented oppositely to the magnet array, approaches the sensing area, it causes a non-zero output so that corresponding outputs Voij can be detected. It is noted that for this case the moving magnet must be always properly oriented, in order to oppose the original DC magnetic bias field of the array of magnets. After detecting the closest non-zero outputs, determining the exact position of the moving pen runs as in the above described case of the digitiser based on the small displacement sensors, by using interpolation technique.

In accordance with an alternative arrangement of this digitiser, one could avoid the use of the array of hard magnets, by processing the non zero outputs of the MDL, using a voltage threshold comparator allowing for processing of those signals with values lower than the lower value of the corresponding weight factors. After that, detection of the area and the exact position of the sensing pen takes place in the same way as for the first digitiser. In this way, there is no need of a special orientation of the moving magnet, although the processing time is significantly increased.

The digitiser based on the small displacement sensor array seems to have the most repeatable operation, because its response doesn't change for a spherical motion of the small magnet around the sensing point. The second type of digitisers based on the large displacement sensors seems to have a uniform response under spherical motion of the hard magnet, only for the case of using an isotropic magnet.

Figure 25:
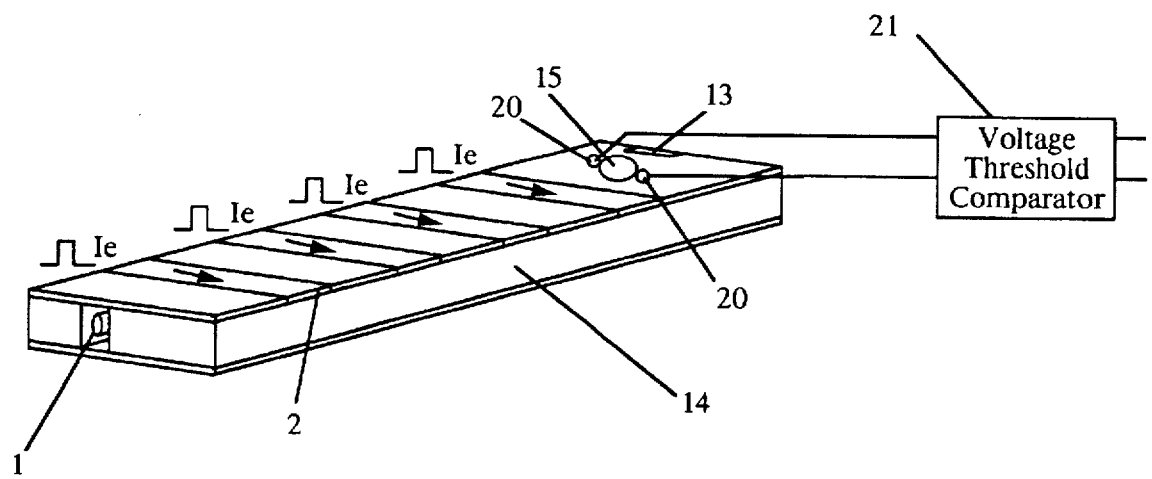
FIG. 25 shows the arrangement employed in a magnetic field distribution sensor in accordance with the present invention.

A specifically interesting application of the improved magnetostrictive delay line technique of the invention is that relating to the measurement of the mangetic field distribution. A magnetic field distribution sensor is herein proposed based on the change of the acoustic pulse at the point of origin of a delay line by changing its biasing magnetic field. The basic arrangement of the herein proposed DC magnetic field distribution sensor comprising the delay line 1, pulsed current conductors 2 and receiving coil 4 is depicted in FIG. 25.

The proposed magnetic field sensor, able to measure DC field distribution and based on the magnetostrictive delay line (MDL) technique, uses soft magnetic ribbons or wires and facilitates the improvements proposed in the present invention. The delay lines are used both for detecting and multiplexing samples of the field.

The operation of a one-dimensional magnetic field sensor preferably comprising an array of MDLs perpendicular to an array of pulsed current conductors with magnetoresistive devices 15 at the receiving point of each MDL and preferably one small field magnet 13 at each of the above receiving points for optimizing the output of the MDL is based on the fact that magnetic bias field, existing at a point of excitation alters the acoustic stress, caused by a pulsed current due to the magnetostriction effect.

Acoustic stress alters because the microstrain response at the point of origin is different under different existing magnetic fields. So, an existing DC magnetic field causes a bias at the point of excitation, altering the microstrain response due to an applied pulsed magnetic field.

It has been found that a DC field applied at an angle with respect to the delay line axis (which is the easy axis of the material), has a contribution on the DC bias effect equal to the contribution of its component along the delay line.

Figure 26:
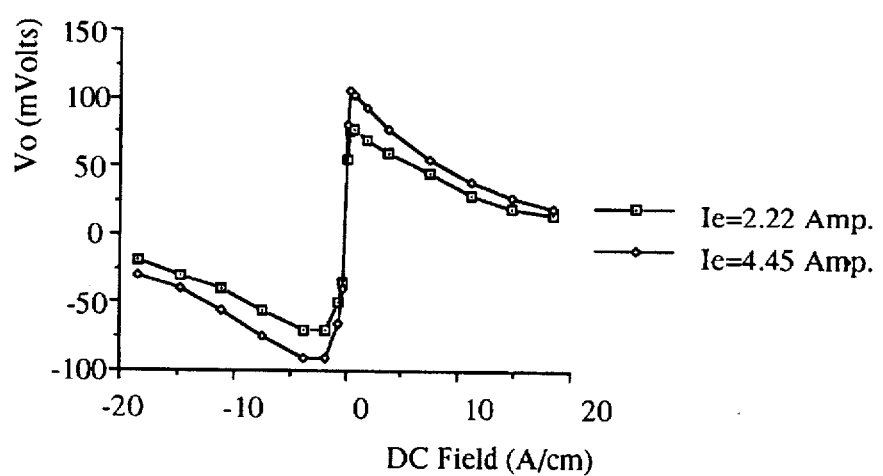
FIG. 26 shows the response of the magnetic field distribution sensor of FIG. 25 for various values of excitation current.

So, by using such a technique, one can find the component of DC magnetic field along the delay line, present at the point of origin of the MDL. The dependence of the MDL peak voltage output Vo on the DC magnetic field along the MDL at the acoustic stress point of origin is illustrated in FIG. 26. Assuming that an array of n wire conductors is arranged orthogonally to the delay line, and pulsed current is applied through them, we can have n discrete readings for the delay line, provided that the points of excitation are far enough apart to avoid mutual interference. The readings give the values of the component of the applied DC magnetic field along the delay line at the corresponding points of excitation. By using an array of m delay lines, orthogonal to the array of the n conductors, we consequently detect m×n values of the component of an applied DC magnetic field along the delay lines.

In accordance with the invention a two-dimensional magnetic field distribution sensor is proposed which, further to the first array of MDLs and normal first array of pulsed current conductors of the one-dimensional magnetic field distribution sensor, comprises a second array of MDLs superimposed and normally oriented to the first array of MDLs and a second array of pulsed current conductors also superimposed and normally oriented to the first array of pulsed current conductors.

Further, in accordance with the invention, a three-dimensional magnetic field distribution sensor is proposed comprising a plurality of the above defined two-dimensional magnetic field distribution arrangements, spaced at a distance corresponding to the resolution sought by this three-dimensional sensor, illustratively at a distance of 1 cm, and further comprising a plurality of magnetostrictive delay lines, passing normally through the thereby formed arrangement of MDLs and pulsed current conductors, where preferably each one such normal magnetostrictive delay line passes as close as possible to each one of the crossing points defined by the above arrangement of MDLs and pulsed current conductors.

Finally, it must be noted that each of the above mentioned one, two or three dimensional magnetic field distribution sensors can in accordance with the invention be used to detect an AC magnetic field, provided that the excitation current is set to have a period half of the period of the detected AC magnetic field.

Such AC magnetic field distribution sensors use Shannon's theorem to determine the frequency and peak value of the AC magnetic field from the detected outputs.

Figure 27:
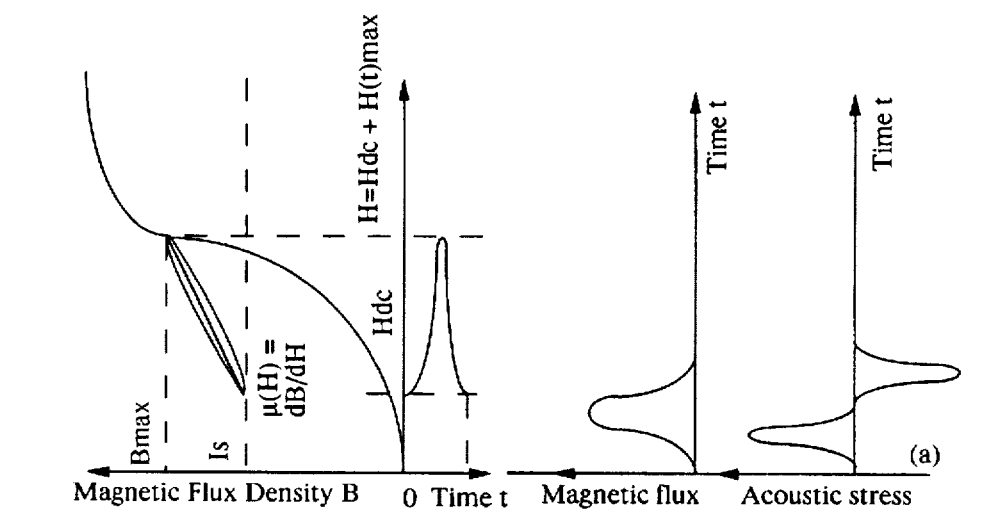
FIG. 27 shows acoustic response of the delay line under DC field codirectional to the pulsed magnetic field.
Figure 28:
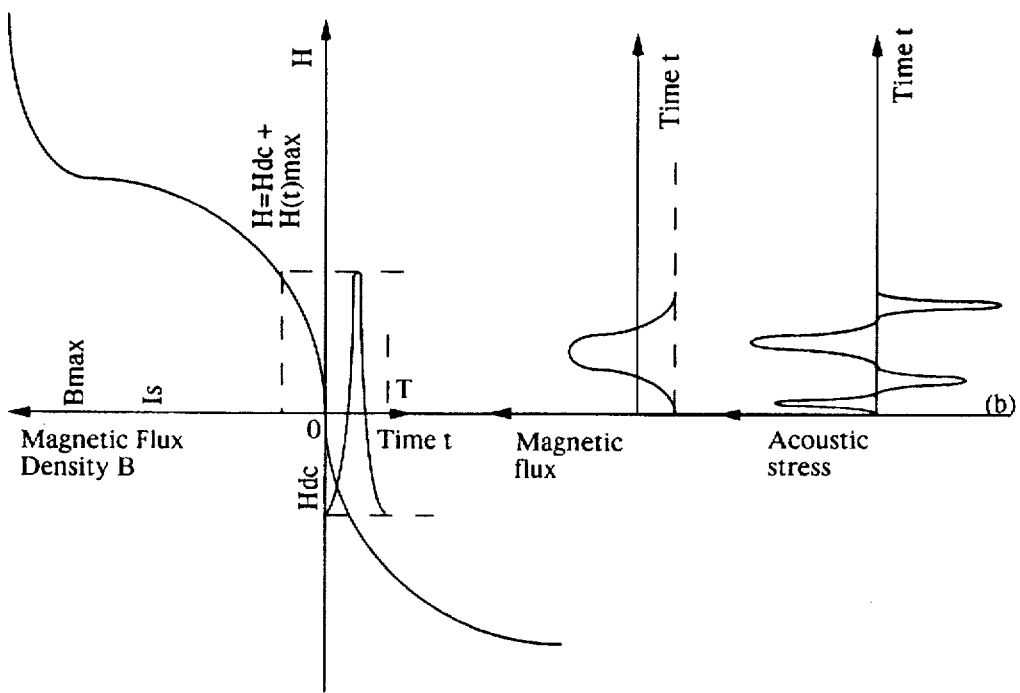
FIG. 28 shows acoustic response of the delay line under small magnitude DC field opposite in direction to the pulsed magnetic field.
Figure 29:
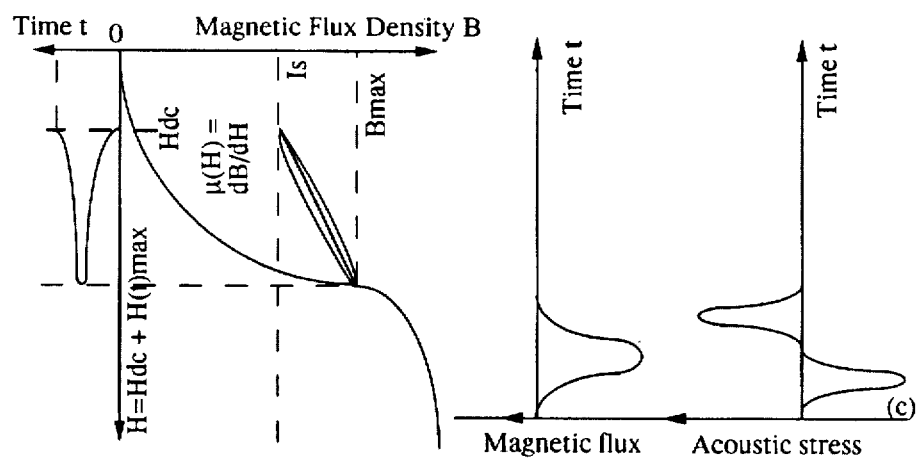
FIG. 29 shows acoustic response of the delay line under large magnitude DC field opposite in direction to the pulsed magnetic field.

It is interesting to study the behaviour of the delay lines under DC bias field. Without any loss of the generality, it is assumed that we are working in the initial magnetization curve. It is also assumed that the acoustic pulse at the point of excitation is due to the first derivative of the square of magnetic flux, while the voltage output from the short coil at the end of the line, is proportional to the first derivative of the acoustic pulse. Three different cases can be distinguished:

i) DC field codirectional to the pulsed magnetic field. Since a pulsed field is applied along the length of the line, a flux change and consequently an acoustic pulse is caused (FIG. 27).

ii) Small-magnitude DC field opposite in direction to the pulsed field. The resulting pulsed flux change and the resulting acoustic stress are given in FIG. 28.

iii) Large DC field opposite in direction to the pulsed field. The resulting flux and acoustic pulse are shown in FIG. 29.

Hereinbelow reference is made to some of the most important characteristics of the above described magnetic field distribution sensor of the present invention.

1. Nonuniformity. It has been reported that nonuniformity (fluctuation of amplitude of readings along the length of the line) of the response along the sensing points of such a magnetic field distibution sensor is a major problem, when the magnetostrictive acoustic delay line technique is used. A first solution is to use stress relieved, stress-current annealed lines, which offer a better degree of uniformity, while the recently developed FeSiB wires after stress and current annealing can be used, as they offer an improved degree of uniformity, and suffer much lower acoustic scattering. On the other hand they will perturb the measured field less, as their cross section is much smaller (about 2% of the above). The normalization process can be applied here as well.

2. Hysteresis. It appears that the hysteresis of the device is very low, since it cannot be measured by a 10-bit Analog to Digital converter. On the other hand, use of annealed materials can further eliminate this problem, since the B-H loop becomes much steeper.

3. Resolution. The resolution of this device depends on the width of the delay lines and the pitch of the wire conductors. For the time being, the obtained resolution is 1 cm×1 cm, which is enough to avoid magnetic coupling between adjacent delay lines. On the other hand, the size of the whole array sensor can easily become of the order of 1×1 meter, while the cost of such a device remains low.

4. Accuracy of measurements. A problem of accurate measurements appears due to the change of the topology of the measurable magnetic field. Such a change mainly occurs because of the presence of the ribbons at the points of magnetic field sensing.

Magnetostrictive delay lines are magnetic materials and their presence into the magnetic field to be measured, causes an alteration of it. As it can be seen in our sensor set-up this effect is eliminated, since the responce curve of the sensor demonstrates the dependence of the MDL output on the magnetic field at the point of origin when the MDL is absent. Such a field is produced by a solenoid around the MDLs, its magnitude being also measured by a Hall-effect magnetic field sensor.

In accordance with a further preferred embodiment of the invention, a variable condition for magnetic circuit change is created by means of a force applied at the point where the pulse is caused, which thereby causes a reflection or distortion of the acoustic signal.

Figure 32:
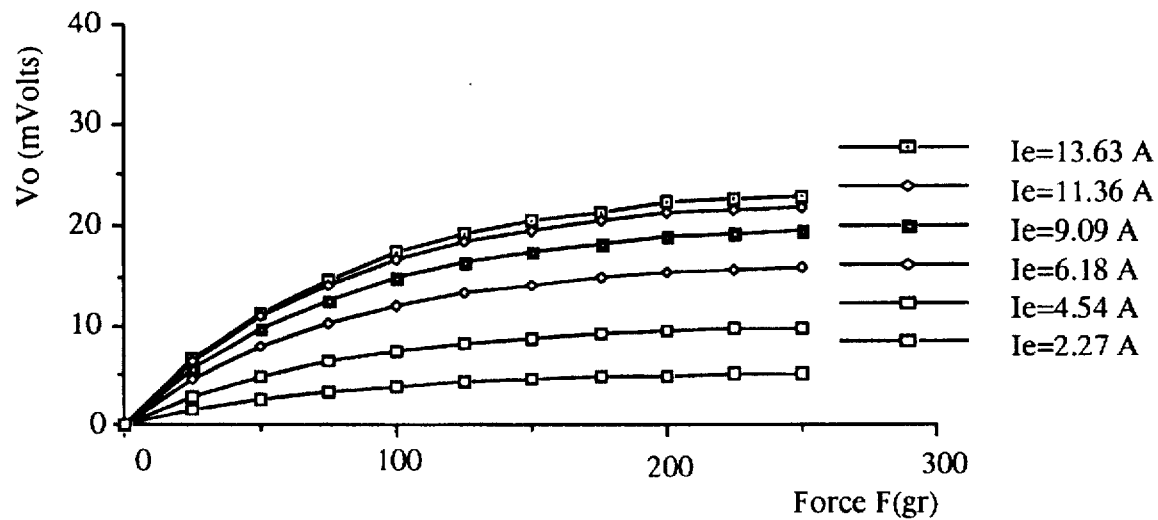
FIG. 32 shows the response of the force sensor of FIG. 30 using FeSiB as cast wire MDL.
Figure 33:
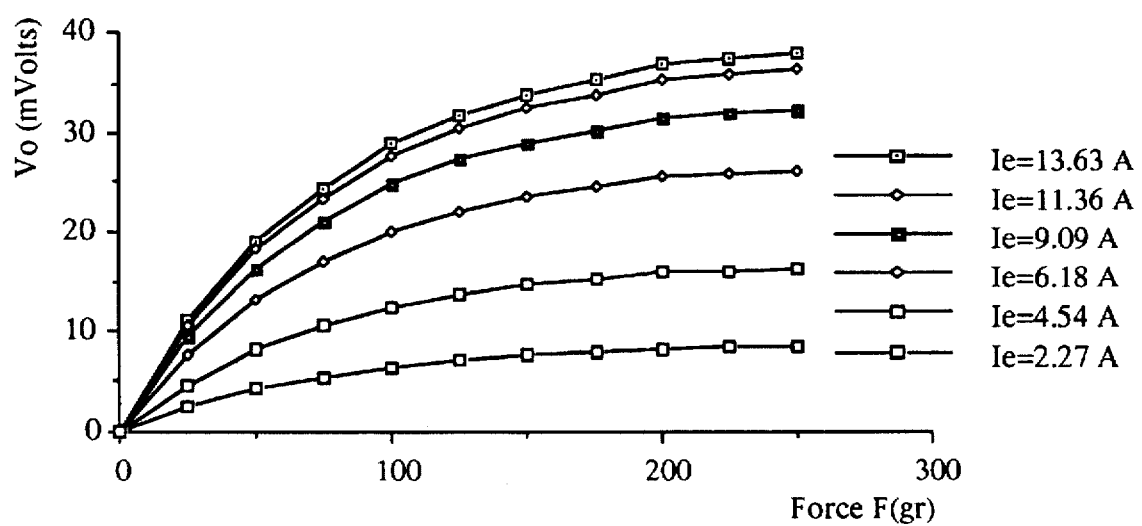
FIG. 33 shows the response of the force sensor of FIG. 30 using a stress current annealed wire MDL.

In accordance with the invention a force sensor operating on the basis of the above principle comprises a delay line positioned in a support thereby being pressed due to forces on this support. A conductor, orthogonal to the delay line is used for pulsed current transmission; its distance is fixed with respect to the delay line. The input and the output of the system are the applied force on the delay line support and the peak of the detected output Vo (or pulse width T) respectively. Under fixed amplitude of the pulsed current, Vo (or T) has a maximum value under zero input, while any force applied on the MDL affects the acoustic pulse which propagates in both directions of the delay line: If the force is applied in between the pulsed current conductor and the receiving means, then the main acoustic pulse is distorted, its magnitude indicating the magnitude of the applied force. If the pulsed current conductor is between the applied force and the receiving means, then a reflected acoustic pulse from the resulting sensing point is also detected, its time delay being the indication for the position where the force is applied and its magnitude indicating the magnitude of the applied force. The dependence of the MDL pulsed voltage output Vo on the force applied on the MDL is shown in FIGS. 32 and 33 for a FeSiB as-cast wire MDL and a stress-current annealed wire MDL respectively.

Various array sensors are proposed in the present invention, based on this variable condition of force causing a reflection or a distortion of the acoustic signal along delay lines under pulsed operation.

The operation of these force sensors is not dependent on the change of magnetic circuits at either the point of origin or the receiving coil, as is the case for a series of sensors based on the MDL technique. The force sensors of the invention are based on changes of the pulsed acoustic waveform due to a mechanical action, applied on the MDL. Hence, for this application the delay line is regarded just as an acoustic medium.

Figure 30:
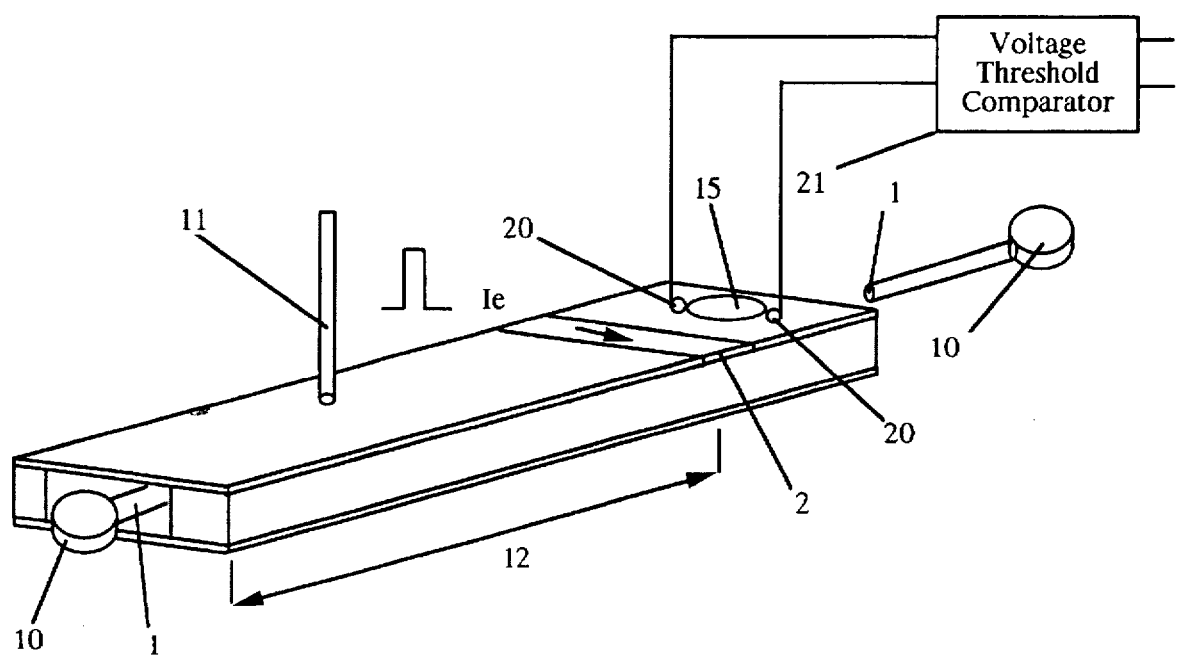
FIG. 30 shows the arrangement employed in a force sensor based on reflections in delay lines.

As depicted in FIG. 30 a first preferred embodiment of a force sensor arrangement is proposed comprising a magnetostrictive delay line 1, positioned within a supporting structure 14, e.g. in a fibre glass channel and including termination adhesive elements 10, e.g. latex adhesive on either end thereof, so as to eliminate any reflection from the delay line ends. In accordance with a preferred embodiment of the invention a pulsed current conductor 2 is placed underneath this channel, thereby avoiding any change of the relative distance between conductor and delay line. Magnetoresistive devices 15 can be used as detecting means.

Applying no force on the channel, and transmitting pulsed current through the conductor, the detected output is Vo. The way to apply a force on the MDL runs as follows:

A smoothly ended cordless pen 11 (2 mm diameter) of any kind of material could be used to cause the reading information: if it attaches and presses the delay line channel at any position, at least 5 cm away from the exciting conductor (in order to avoid any interference with the original pulse), creating thus a sensing point, the displaced upper fibre glass wall attaches and exerts pressure upon the delay line with a force which is dependent on the geometry of the supporting structure 14. An acoustic reflection is caused at this point, as a result of this pressure. The magnitude of such a reflection depends on the force applied on the delay line, as well as on the material applying it. The reflected acoustic pulse is detected by the magnetoresistive device 15 and the delay between the peak value of the original and the reflected signal defines the distance between conductor and sensing point, whilst the amplitude of the reflection is monotonically related to the applied force.

The minimum detectable force on the supporting structure 14 is 0.1 Newton. Sensing area of the device is not the whole MDL, but its part defined by arrow 12 constituting the effective length of the delay line on either side of the sensing point.

The performance of this device is quite predictable and there is an indication that no hysteresis appears in its operation. The low cost of this device is due to the ease of assemplying it and the low cost of materials and electronics needed.

Figure 31:
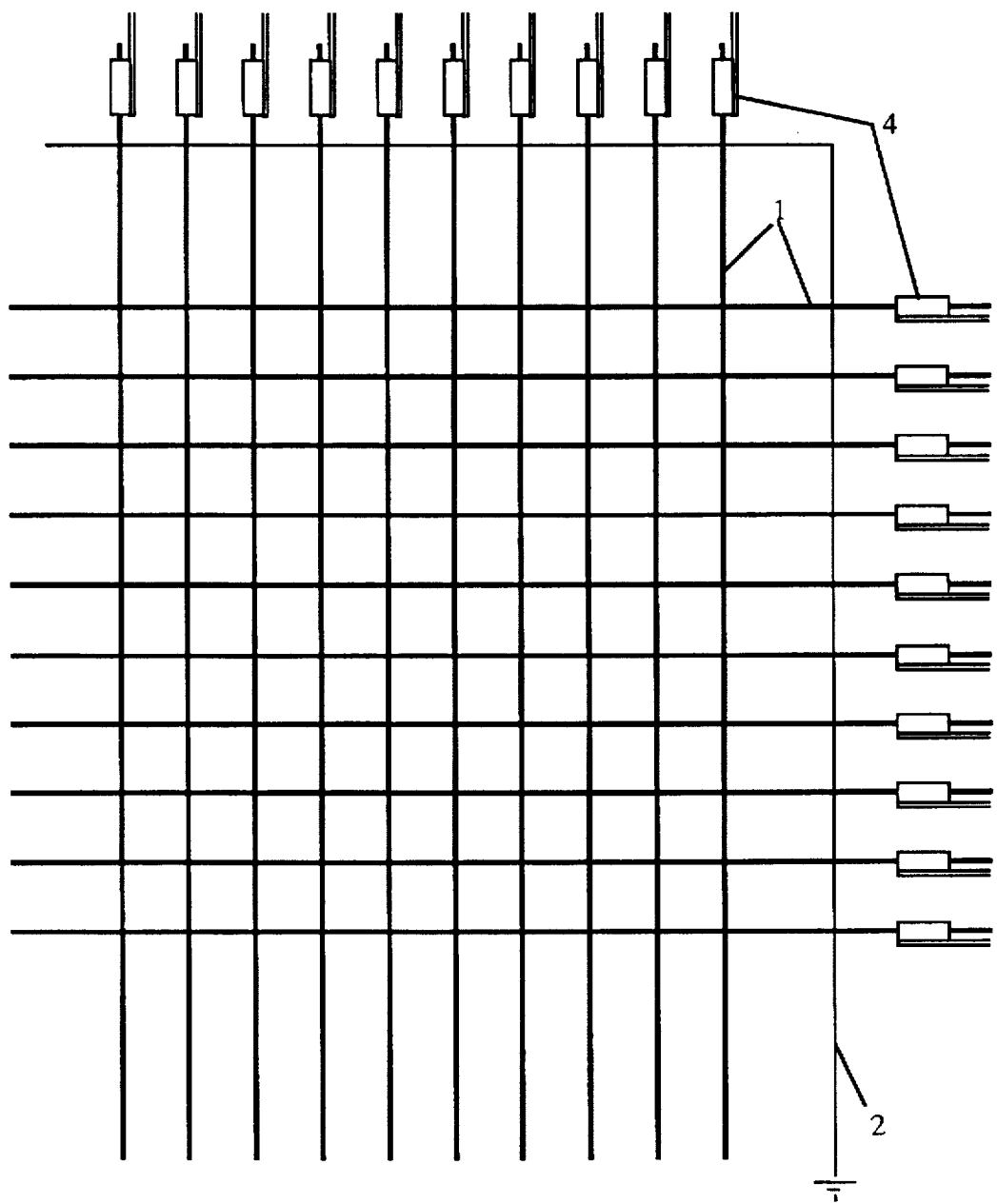
FIG. 31 shows the arrangement employed in a two dimensional force sensor array, based on the sensor of FIG. 30.

A way to apply such an idea for sensing a force over a surface instead of a line is proposed next. As depicted in FIG. 31, a pulsed current conductor 2 crosses an array of MDLs. The arrangement of conductor 2 is as previously. The magnetostrictive delay lines 1 are positioned within above mentioned supporting structures 14, which are made by using 0.2 mm thick fibre glass walls for the two external walls and 0.1 mm thick and 1 mm wide fibre glass ribbons for the middle one. The pitch between adjacent ribbons can be of the order of 5 mm. The resulting acoustic pulse along the delay line is detected by short detecting coils 4 or preferably magnetoresistive devices 15 between the conductor and the end of each delay line. If a force is applied on the movable mat above a MDL, it can be detected by the corresponding detecting means. Apart from the main pulse, a second pulse is detected, corresponding to the MDL on which force is applied. Delay between main and reflected pulse defines the sensing point of this MDL. The magnitude of this pulse defines the force applied on the line.

It is hereby noted that a detecting delay line 16 can be set at an angle to the sensing delay line array, preferably at an angle of 45 degrees, in order to detect the reflected signal, the number of detecting means being thus decreased to two, as depicted in FIG. 45.

Such a device can be used as a digitizer, which can detect both the position and magnitude of the applied force.

It can be cheaper than digitisers of the prior art, since the labour involved in making the long receiving coils is avoided and replaced by the labour needed for manufacturing the sensor substrates. This device has effectively no hysteresis, a predictable nonuniformity due to the acoustic attenuation, an easily obtained resolution of 0.1 mm along the length of the MDL, while the exponential expression of its response, can be used for accurate measurements of the applied force.

It is obvious that there are many applications in which this ability can be used. One application is a digitiser which can recognize signatures, by observing not only the path followed on signing but the pressure applied at each point of the signature in real time.

Figure 34:
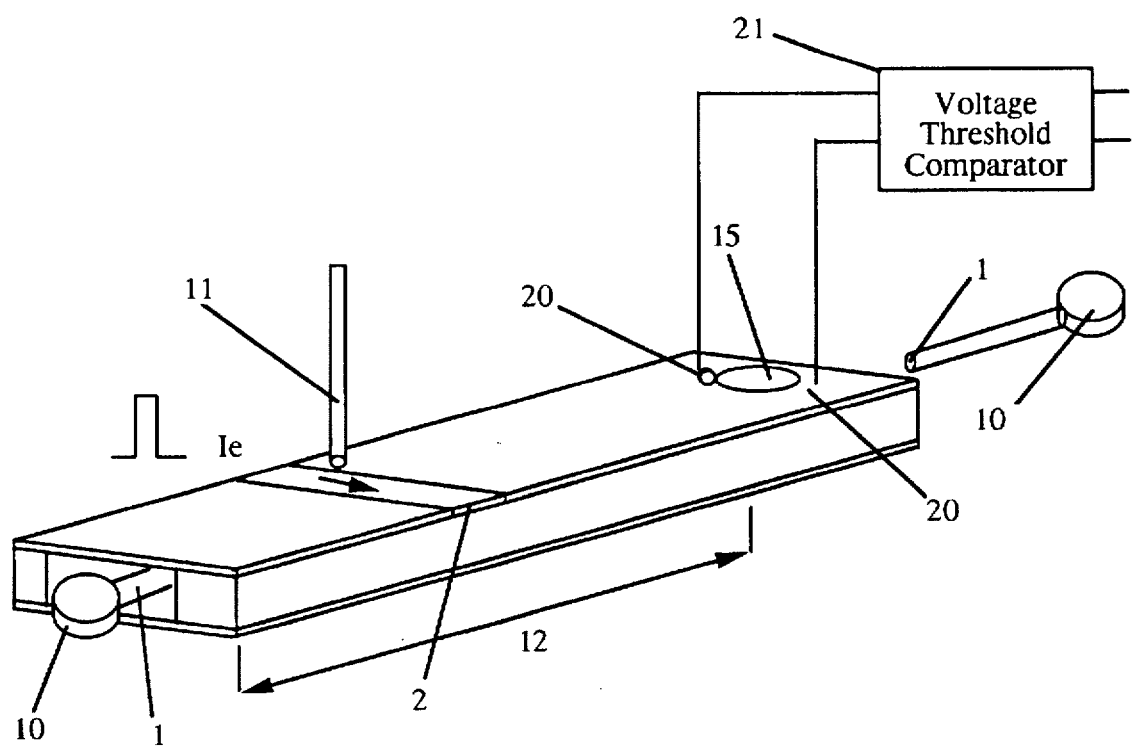
FIG. 34 shows the arrangement employed in a force sensor based on distortion of the acoustic signal.

As depicted in FIG. 34, a first preferred embodiment of another force sensor arrangement is proposed comprising the elements of FIG. 30, the force being applied at any point between the point of origin and the receiving point, and preferably applied at the point of origin, in order to cause distortion of the main detected pulse.

With respect to the given geometry, a force F, on the upper surface of the supporting structure could cause a pressure on the MDL. It is expected that the acoustic pulse and the detected peak Vo, should vanish at a certain value of that pressure.

Figure 35:
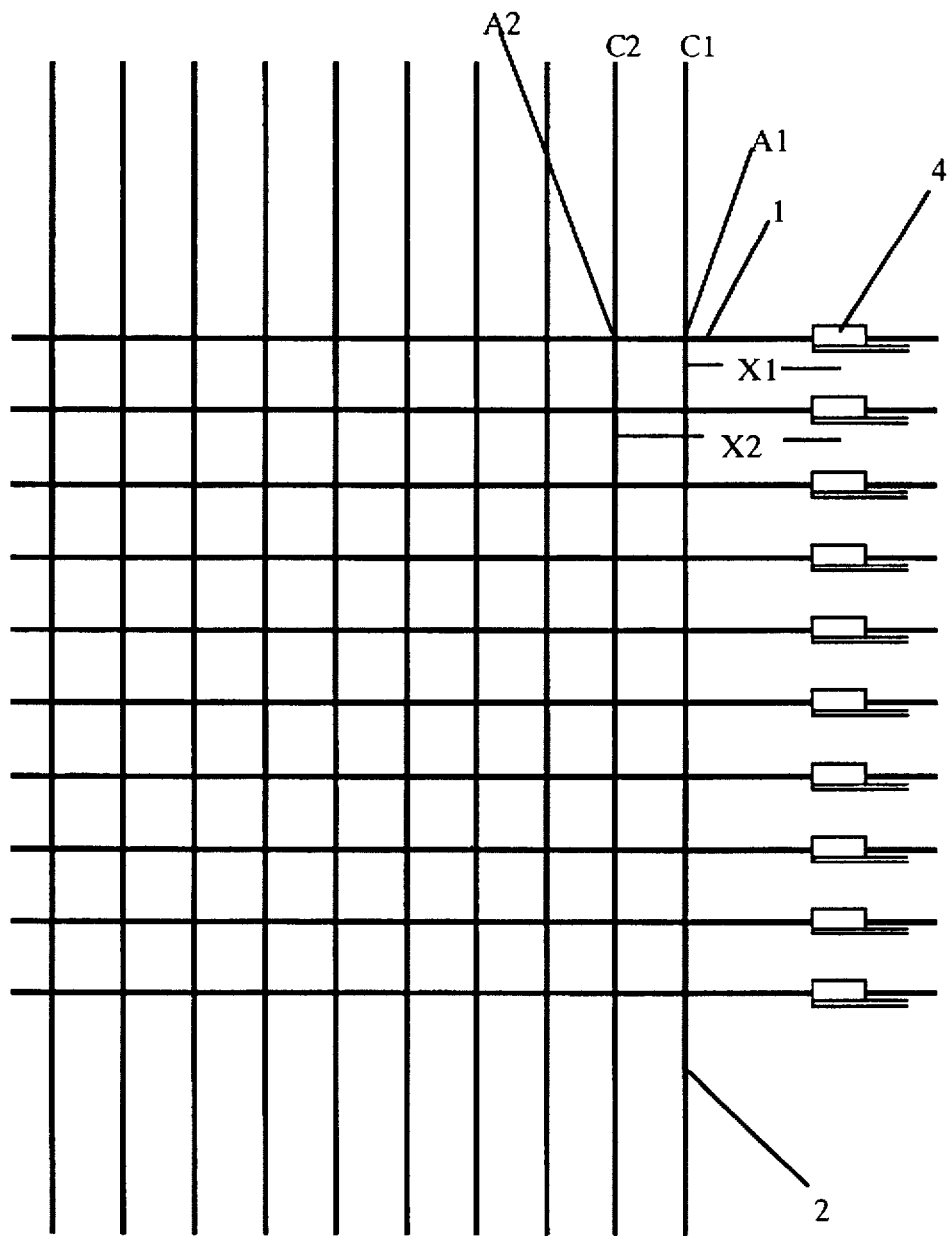
FIG. 35 shows an illustrative arrangement of a two-dimensional force sensor, based on the force sensor depicted in FIG. 34.

This kind of discrete force sensor could be used as the basis for a force distribution transducer, as depicted in FIG. 35. The reasoning for that is as follows: Let us assume that two forces F1 and F2 are applied at two sensing points A1 and A2, which are defined by the crossing points of the MDL and two conducting wires C1 and C2, orthogonal to the line as shown in FIG. 35, in distances x1 and x2 from the receiving coil respectively. The acoustic pulse caused by the conductor C1 changes due to the two forces F1 and F2, so that the pulsed voltage at the receiving coil is related to F1 and F2. On the other hand, the acoustic pulse caused by the conductor C2 changes due to force F2. Thus normalised Vo values detected at points A1 and A2 give the values of F1 and F2.

Figure 36:
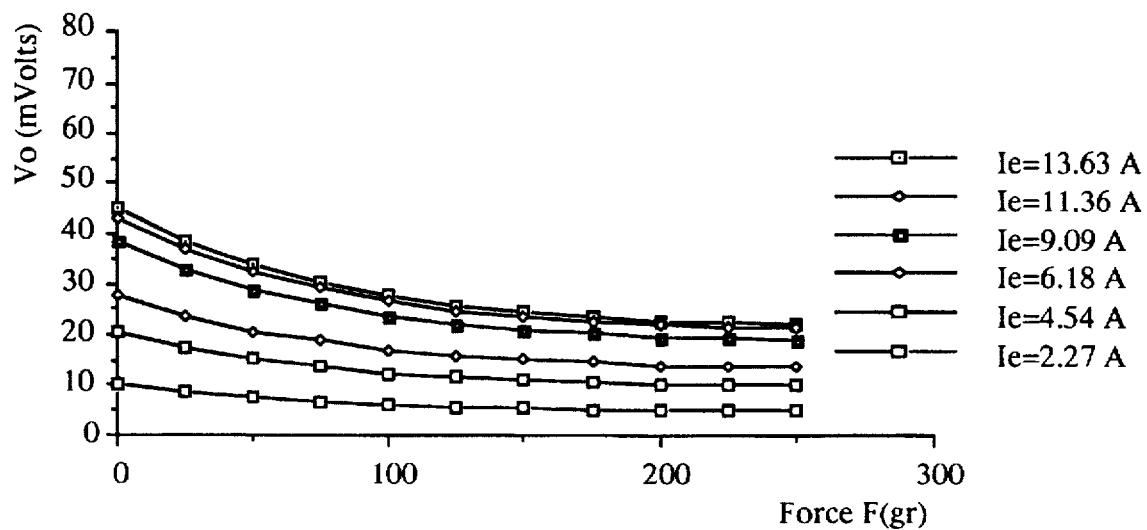
FIG. 36 shows the response of the force sensor of FIG. 34 using FeSiB as cast wire MDL.

In FIG. 36 is depicted the dependence of Vo on the applied force F concerning as-cast amorphous FeSiB wire magnetostrictive delay line.

Figure 37:
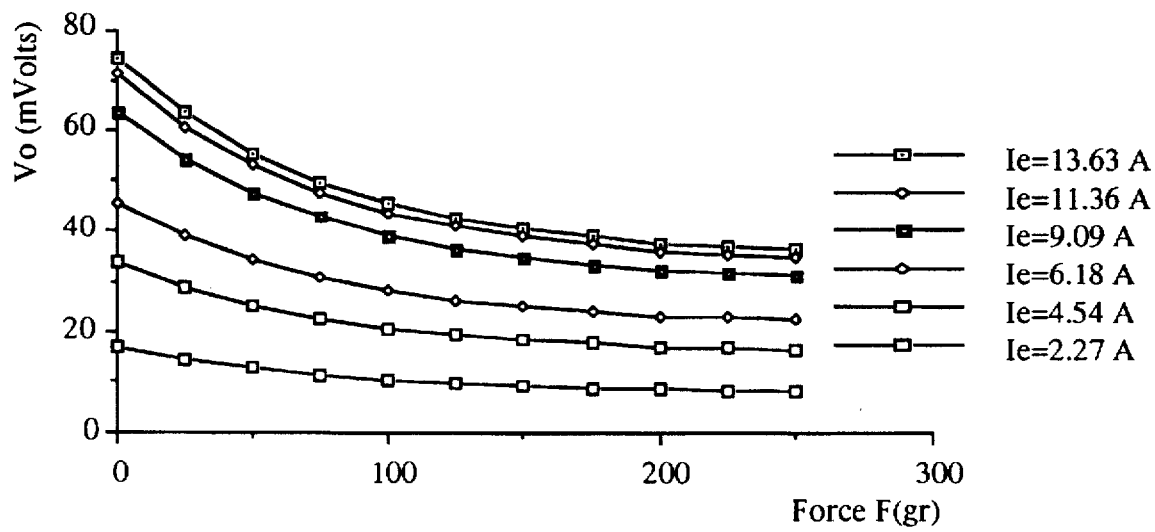
FIG. 37 shows the response of the force sensor of FIG. 34 using a stress-current annealed wire MDL.

In FIG. 37 is depicted the dependence of Vo on the applied force F concerning stress-current annealed FeSiB wire magnetostrictive delay line.

From the experimental results it can be concluded that the pulsed voltage output Vo due to a force F at a sensing point is an exponential function of the force.

In the herein described force sensor array, the force distribution could be determined as follows: pulsed current is transmitted first to the conductor closest to the receiving coil C1 and the force F1 can be calculated. Afterwards, conductors C2, C3, . . . ,Cm are excited and forces F2, F3, . . . ,Fm can also be calculated. All this procedure can be applied with the assumption that applied forces are small enough not to cause the detected output signals to vanish.

Figure 39:
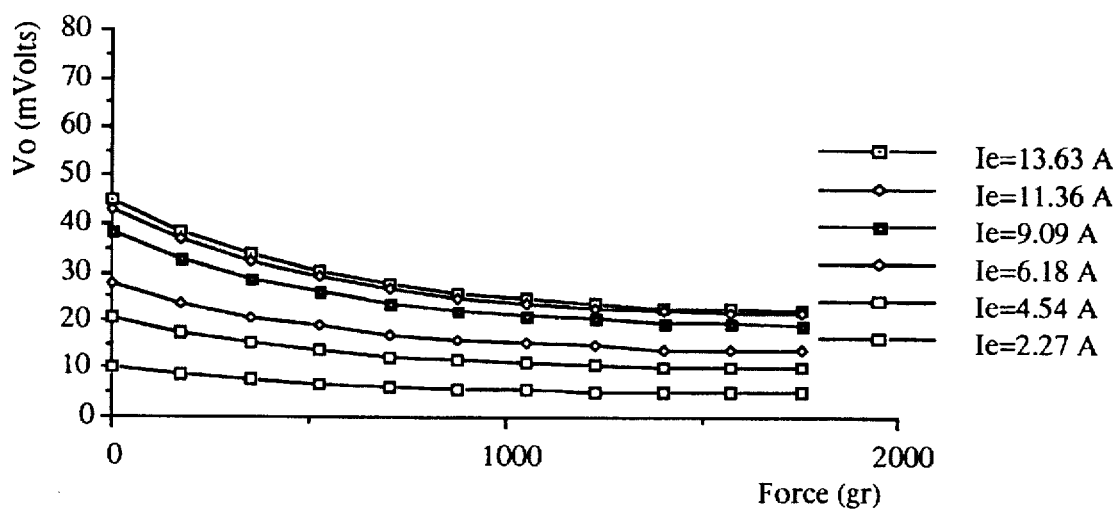
FIG. 39 shows the response of the force sensor of FIG. 38 with FeSiB as cast wire MDL.
Figure 40:
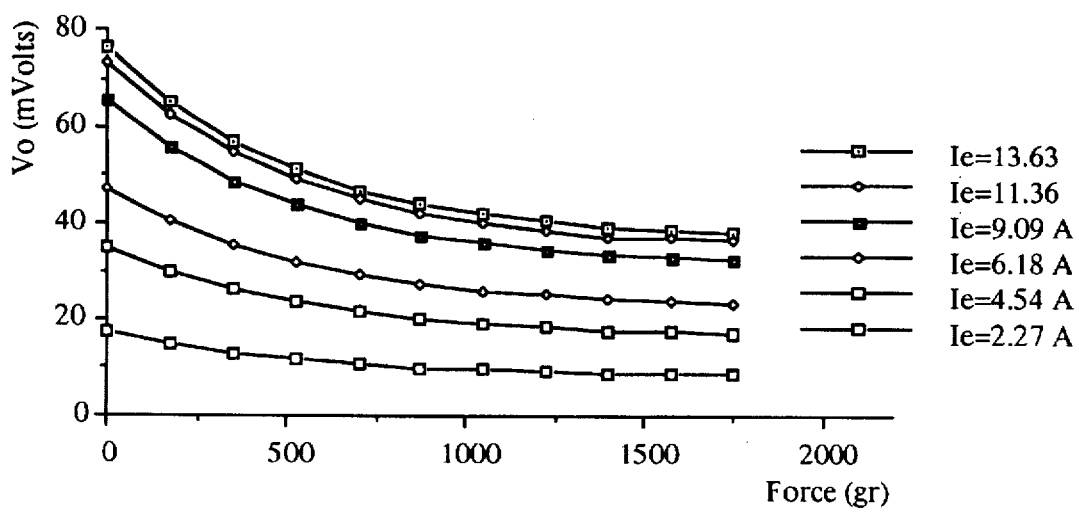
FIG. 40 shows the response of the force sensor of FIG. 38 using a stress-current annealed wire MDL.

As depicted in FIG. 38, in accordance with another embodiment of the invention, a tensile stress sensor is proposed, based on the elimination of the magnetomechanical coupling factor of the MDL. As force F is applied along the MDL, a tensile stress occurs, which decreases monotonically the magnetomechanical coupling factor of the MDL. The performance of this sensor is illustrated in the graphs of FIGS. 39 and 40.

Figure 43:
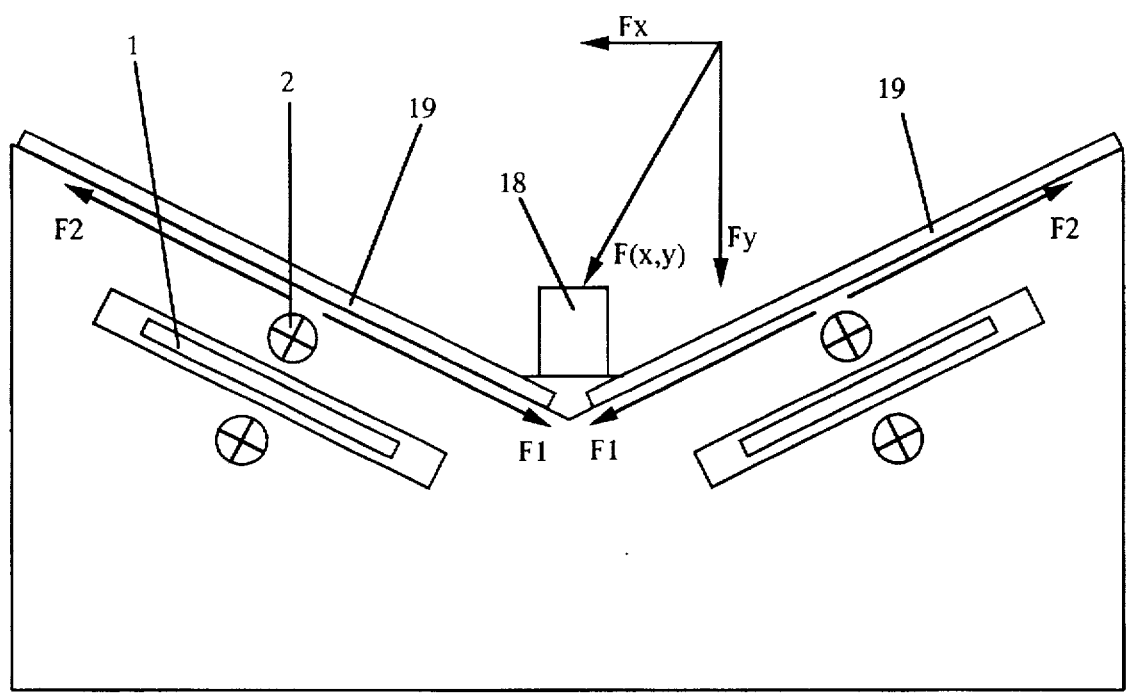
FIG. 43 shows a force sensor arrangement, employing a two dimensional finite sensing element.

Another embodiment is depicted in FIG. 43, comprising two magnetostrictive delay lines, a sensing point 18 whereupon the force F is applied, and two magnetically soft active cores 19, the structure being able to be repeated along the non illustrated axis. Pulsed current conductors 2 are set above and below the MDLs. Detecting means, preferably magnetoresistive devices 15 are set at the end of the MDLs. When no force is applied on the sensing point 18, the output of the detecting means is a maximum. When a force is applied on the sensing point 18 it is analysed into two components, so that the magnitude of force which stresses or compresses the two active cores 19 is not the same, resulting thus in different responses at the output of the two MDLs. Hence, the two components of the applied force F can be defined by analysing the output of the two MDLs.

The idea of a two-dimensional discrete force sensor as depicted in FIG. 43, extending the idea of the force beam sensing element of Reilly's U.S. Pat. No. 4,954,711 can be enhanced to provide a three-dimensional sensing element by duplicating the arrangement of FIG. 43 in a way that the two active cores 19 are normal to each other.

Various other applications can be developed based on the above described principles of the invention. Thus, it must hereby be noted that any change or amendment in the sizes, forms, dimensions, materials and accessories used in the manufacturing and assemblying process, testing and assemblying methods and means, and field of applications, must, as long as they do not contribute towards a technical solution to an existing problem and do not constitute a new inventive step, be considered part of the aims and scope of the present invention.

I claim:

1. A sensor array comprising:

a plurality of parallel stress-current annealed sensing magnetostrictive delay lines made of a magnetostrictive material, a plurality of parallel pulsed current conductors located at right angles to each one of said magnetostrictive delay lines, the crossing point of each one of said pulsed current conductors and each one of said magnetostrictive delay lines defining an acoustic stress point of origin of the sensor array, means for generating current pulses in said plurality of parallel pulsed current conductors, each one of said current pulses causing an acoustic stress at each one of said acoustic stress points of origin propagating along each one of said magnetostrictive delay lines, a plurality of magnetoresistive devices, each one of said magnetoresistive devices being located at a receiving point of each one of said magnetostrictive delay lines, each one of said magnetostrictive delay lines and each one of said pulsed current conductors and each one of said magnetoresistive devices defining a magnetic circuit of the sensor array, a change of magnetic flux being induced at each one of said plurality of magnetoresistive devices, as a result of each one of said plurality of acoustic stresses propagating along each one of said magnetostrictive delay lines, said change of magnetic flux producing a pulsed voltage output at the two ends of each one of said plurality of magnetoresistive devices, a plurality of means for inducing a change in said magnetic circuit and in one of said pulsed voltage outputs, each one of said means for inducing a change in said magnetic circuit being located at any point of each one of said magnetostrictive delay lines, said point being a sensing point of the sensor array, a plurality of small field magnets close to each one of said receiving points of said magnetostrictive delay lines to maximise each one of said pulsed voltage outputs, means for measuring the value of pulse width T of each one of said pulsed voltage outputs, said means being connected at said two ends of each one of said plurality of magnetoresistive devices and obtaining said pulsed voltage outputs therefrom, including a voltage threshold comparator to monitor said value of pulse width T of each one of said pulsed voltage outputs, said value being normalized by means of multiplying it with a weight factor, said weight factor being selected to be the inverse maximum pulse width of the corresponding said pulsed voltage output, said weight factor being retrieved from a previously electronically stored weight factor table.

2. A sensor array adapted to work as a digitiser, comprising:

a plurality of parallel stress-current annealed sensing magnetostrictive delay lines made of a magnetostrictive material, a first plurality of parallel pulsed current conductors located at right angles to said magnetostrictive delay lines, means for generating current pulses in each one of said plurality of pulsed current conductors, a cordless pen creating at least one acoustic stress propagating along at least one of said plurality of magnetostrictive delay lines when brought at any point above said plurality of magnetostrictive delay lines and said first plurality of pulsed current conductors, said point being a sensing point of the digitiser, a small field magnet close to said sensing point of the digitiser to maximize said acoustic stress propagating along at least one of said plurality of magnetostrictive delay lines, a detecting magnetostrictive delay line with two detecting coils at two ends thereof, said detecting magnetostrictive delay line being disposed at an angle of 45 degrees with respect to said plurality of sensing magnetostrictive delay lines, said acoustic stress propagating along at least one of said plurality of magnetostrictive delay lines resulting in a magnetic coupling between said at least one of said plurality of magnetostrictive delay lines and said detecting magnetostrictive delay line, said magnetic coupling inducing a pulsed voltage output at said detecting coils on either side of said magnetostrictive delay line, a small field magnet close to each one of said two detecting coils at the ends of said detecting magnetostrictive delay line to maximize said pulsed voltage output, and means for measuring the value of pulse width T of said pulsed voltage output, said means being connected at said two detecting coils at the two ends of said detecting magnetostrictive delay line and obtaining said pulsed voltage output therefrom, said means including a voltage threshold comparator to monitor said value of the output pulse width T, said value being normalized by means of multiplying it with a weight factor, said weight factor being selected to be the inverse maximum pulse width of the corresponding said pulsed voltage output, said weight factor being retrieved from a previously electronically stored weight factor table.

3. A sensor array according to claim 1, further comprising a plurality of small field magnets, each one of said small field magnets located close to each one of said acoustic stress points of origin of each one of said magnetostrictive delay lines to maximise said acoustic stress at each one of said acoustic stress points of origin and wherein a change in said magnetic circuit at a sensing point of the sensor array is induced by means of the displacement of said means for inducing a change in said magnetic circuit along a planar or curved surface of said sensor array.

4. A sensor array according to claim 3, wherein a change in said magnetic circuit at a sensing point of the sensor array is induced by means of a first arrangement of movable soft magnetic cores, located close to each one of said acoustic stress points of origin, said acoustic stress points of origin being said sensing points of said sensor array, a measured parameter of each one of said pulsed voltage outputs being dependent upon the distance of each one of said movable soft magnetic cores from said sensing point, wherein said pulsed current is transmitted in said plurality of parallel pulsed current conductors to excite said plurality of magnetostrictive delay lines, said sensor array being particularly adapted to be used in the measurement of displacement of objects along a surface, said displacement being confined in a range of 0-2 mm.

5. A sensor array according to claim 4, wherein each one of said arrangement of pulsed current conductors is located in between each one of said movable soft magnetic cores and each one of said magnetostrictive delay lines and the monitored displacement is the distance between each one of said movable soft magnetic cores and the corresponding each one of said pulsed current conductors of said arrangement of pulsed current conductors.

6. A sensor array according to claim 4, wherein each one of said magnetostrictive delay lines lies in between each one of said first arrangement of movable soft magnetic cores and each of said plurality of pulsed current conductors and the monitored displacement is the distance between each said movable soft magnetic core and each said magnetostrictive delay line.

7. A sensor array according to claim 4, wherein when said plurality of parallel pulsed current conductors is located above said plurality of parallel magnetostrictive delay lines, a further plurality of parallel pulse current conductors is located symmetrically below and at right angles to said plurality of parallel magnetostrictive delay lines, each one of said plurality of parallel pulsed current conductors below said plurality of parallel magnetostrictive delay lines being parallel to each one of said plurality of parallel pulsed current conductors above said plurality of parallel magnetostrictive delay lines and supplied with pulsed current in the same direction as said plurality of pulsed current conductors above said plurality of parallel magnetostrictive delay lines, at least one of said movable soft magnetic cores being located above each one of said plurality of pulsed current conductors above said plurality of maganetostrictive delay lines or below each one of said plurality of pulsed current conductors below said plurality of parallel magnetostrictive delay lines, the monitored displacement being the distance between each one of said movable soft magnetic cores and the corresponding each one of said plurality of parallel pulsed current conductors above said plurality of parallel magnetostrictive delay lines or said plurality of pulsed current conductors below said plurality of magnetostrictive delay lines, whichever is closer to it.

8. A sensor array according to claim 7, further comprising a second arrangement of movable soft magnetic cores, at least one of said second arrangement of movable soft magnetic cores being located underneath each said sensing point and said plurality of parallel pulsed current conductors below said plurality of parallel magnetostrictive delay lines, wherein each movable soft magnetic core of said second arrangement of movable soft magnetic cores is fixedly connected to a corresponding overlying movable soft magnetic core of said first arrangement of soft magnetic cores lying above each one of said plurality of pulsed current conductors above said plurality of magnetostrictive delay lines, wherein when no displacement is applied said first arrangement of movable soft magnetic cores is located at a maximum distance above said magnetostrictive delay lines and said second arrangement of movable soft magnetic cores is located at a minimum distance below said magnetostrictive delay lines and wherein a measured parameter of said pulsed voltage output is dependent upon displacement of either of said first or said second arrangement of movable soft magnetic cores.

9. A sensor array according to claim 3, wherein each one of said means for inducing a change in said magnetic circuit at a sensing point is a movable magnet, each one of said sensing points being coincident with each one of said acoustic stress points of origin of each one of said magnetostrictive delay lines, at least one said movable magnet located above each said sensing point of the sensor array and oriented along the length of said magnetostrictive delay line, the sensor array further comprising an array of hard magnets, at least one hard magnet fixedly mounted underneath each said sensing point and oriented in a direction opposing said movable magnet, said hard magnet acting so as to eliminate the output of said magnetostrictive delay lines in the absense of said movable magnets, a measured parameter of said pulsed voltage output being dependent upon the distance of each of said movable magnets from said acoustic stress point of origin wherein pulsed current of constant amplitude is transmitted through said pulsed current conductor, said sensor array being particularly adapted to be used in the measurement of large displacement of objects along a planar or curved surface, said displacement being confined within a range of 2-20 mm.

10. A sensor array according to claim 3, further comprising a long coil around each said magnetostrictive delay line, each one of said means for inducing a change in said magnetic circuit being an arrangement of movable small field magnets on top of said long coil, the crossing point of each said small field magnet and said long coil around said magnetostrictive delay line defining a sensing point of the sensor array, a measured parameter of said pulsed voltage output being dependent upon the distance of said movable small field magnets from said magnetostrictive delay line when said magnetostrictive delay line is excited by a pulsed current applied to said pulsed current conductor, said sensor array being particularly adapted to be used in the measurement of large displacement of objects along a planar or curved surface, said displacement being confined within a range of 2–20 mm.

11. A sensor array according to claim 9, wherein to obtain an increased bidimensional resolution it further comprises a second plurality of said parallel magnetostrictive delay lines, positioned at right angles to a first said plurality of parallel magnetostrictive delay lines, wherein a single arrangement of parallel pulsed current conductors is used when turned by 90 degrees to alternately excite said first and said second array of magnetostrictive delay lines.

12. A sensor array adapted to work as a digitiser according to claim 2, further comprising a second plurality of parallel pulsed current conductors each one of said second plurality of pulsed current conductors being parallel to each one of said first plurality of pulsed current conductors, said first plurality of pulsed current conductors being located below and each said second plurality of pulsed current conductors being located above said plurality of magnetostrictive delay lines, said cordless pen comprising a soft magnet at the edge thereof, said cordless pen moving close to said plurality of magnetostrictive delay lines and said plurality of pulsed current conductors, wherein said pulsed voltage outputs induced at said detecting coils on either side of said detecting magnetostrictive delay line are used to define by means of interpolation technique the position of said cordless pen in the neighbourhood of said cordless pen, displacement of said cordless sensing pen being confined in a range of 0–2 mm.

13. A sensor array adapted to work as a digitiser according to claim 2, further comprising a plurality of hard magnets, each one of said hard magnets being located underneath said first plurality of pulsed current conductors, said cordless pen comprising a hard magnet at the edge thereof, said cordless pen moving close to said plurality of magnetostrictive delay lines and said plurality of pulsed current conductors, wherein said pulsed voltage outputs induced at said detecting coils on either side of said detecting magnetostrictive delay line are used to define, by means of interpolation technique, the position of said cordless pen in the neighbourhood of said plurality of magnetostrictive delay lines and said plurality of pulsed current conductors, displacement of said cordless sensing pen being confined in a range of 2–20 mm.

14. A sensor array according to claim 1, adapted to work as a magnetic field distribution sensor, wherein a change in said magnetic circuit at a sensing point of the sensor array is induced by means of the presence of a DC magnetic field the distribution of which is to be detected, change of said DC magnetic field at each one of said acoustic stress points of origin, causing a change of acoustic stress at each one of said acoustic stress points of origin, said acoustic stress being received as a change in one of said pulsed voltage outputs, wherein said DC magnetic field is applied in any direction along said magnetostrictive delay line, said magnetic field distribution sensor being used to measure said magnetic field in one dimension.

15. A sensor array according to claim 14, adapted to work as a magnetic field distribution sensor, further comprising a further array of magnetostrictive delay lines superimposed and normally oriented towards said plurality of sensing magnetostrictive delay lines and an array of pulsed current conductors at right angles to said further array of magnetostrictive delay lines, said magnetic field distribution sensor being used to measure said magnetic field in two dimensions.

16. A sensor array according to claim 15, adapted to work as a magnetic field distribution sensor, comprising a plurality of arrangements of magnetostrictive delay lines and pulsed current conductors, spaced at a distance corresponding to the desired resolution of said magnetic field distribution sensor, each said arrangement comprising a first plurality of magnetostrictive delay lines with a first plurality of pulsed current conductors at right angles to said first plurality of magnetostrictive delay lines and a second plurality of magnetostrictive delay lines superimposed and normally oriented towards said first plurality of magnetostrictive delay lines and a second plurality of pulsed current conductors at right angles to said second plurality of magnetostrictive delay lines, and a third plurality of magnetostrictive delay lines passing normally through said plurality of arrangements of magnetostrictive delay lines and pulsed current conductors, each one of said third plurality of magnetostrictive delay lines passing as close as possible to each of the crossing points defined by said plurality of arrangements of magnetostrictive delay lines and pulsed current conductors, said magnetic field distribution sensor being used to measure said magnetic field in three dimensions.

17. A sensor array according to the claim 1, adapted to work as a magnetic field distribution sensor used in detecting an AC magnetic field, wherein said current pulses in said pulsed current conductors are set to have a period with a value half that of the period of the AC magnetic field to be detected.

18. A sensor array according to claim 1, further comprising a plurality of small field magnets, each one of said small field magnets located close to each one of said acoustic stress points of origin of each one of said magnetostrictive delay lines to maximise said acoustic stress at each one of said acoustic stress points of origin and wherein a change in said magnetic circuit at a sensing point of the sensor array is induced by means of a force applied by means of a smoothly ended cordless pen, said force causing a distortion of said acoustic stress propagating along said magnetostrictive delay line when exerted upon a supporting structure within which is attached each one of said magnetostrictive delay lines, said force being applied at a point anywhere in between each one of said acoustic stress points of origin and said receiving point, wherein the distortion of said acoustic stress causes a change in one of said pulsed voltage outputs and indicates the magnitude of said applied force.

19. A sensor array according to claim 1, wherein said plurality of parallel pulsed current conductors comprises one single pulsed current conductor at right angles to said plurality of magnetostrictive delay lines, further comprising a plurality of small field magnets, each one of said small field magnets located close to said acoustic stress point of origin of each one of said magnetostrictive delay lines, to maximise said acoustic stress at each one of said magnetostrictive delay lines and wherein each one of said means for inducing a change in said magnetic circuit at a sensing point of said sensor array is a force applied by means of a smoothly ended cordless pen, said force causing a reflection of said acoustic stress propagating along said magnetostrictive delay line when exerted upon a supporting structure within which is attached each one of said magnetostrictive delay lines, said force being applied at a point such that said single pulsed current conductor is situated anywhere in between the point upon which said force is applied and said receiving point.

20. A sensor array adapted to work as a digitiser according to claim 19, the magnitude of said pulsed voltage output indicating the magnitude of said applied force and its time delay indicating the point whereupon said force is applied.

21. A sensor array according to claim 1, further comprising a plurality of small field magnets, each one of said small field magnets located close to each one of said acoustic stress points of origin of each one of said magnetostrictive delay lines to maximise said acoustic stress at each one of said acoustic stress points of origin and wherein a change in said magnetic circuit at a sensing point of the sensor array is induced by means of a force applied by means of a smoothly ended cordless pen, said force causing a distortion of said acoustic stress propagating along said magnetostrictive delay line when exerted upon a supporting structure within which is attached each one of said magnetostrictive delay lines, said force being applied at a point such that said smoothly ended cordless pen is situated anywhere in between each one of said acoustic stress points of origin and said receiving point, wherein the distortion of said acoustic stress causes a change in one of said pulsed voltage outputs and indicating the magnitude of said applied force.

22. A sensor array according to claim 21, adapted to work as a force distribution sensor array, wherein said force is applied onto each one of said acoustic stress points of origin and is calculated following monitoring of said pulsed voltage output received after a sequential excitation of each one of said pulsed current conductors.

23. A sensor array according to claim 1, wherein a change in said magnetic circuit is induced by means of a force applied along said magnetostictive delay line, wherein said force causes a monotonical decrease of a magnetomechanical coupling factor of said magnetostrictive delay line and is calculated through monitoring said pulsed voltage output.

* * * * *